(12) United States Patent
Hirano et al.

(10) Patent No.: US 7,498,116 B2
(45) Date of Patent: Mar. 3, 2009

(54) RESIST COMPOSITION AND PATTERN FORMATION METHOD USING THE SAME

(75) Inventors: Shuji Hirano, Shizuoka (JP); Shinichi Sugiyama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/057,931

(22) Filed: Mar. 28, 2008

(65) Prior Publication Data

US 2008/0241750 A1    Oct. 2, 2008

(30) Foreign Application Priority Data

Mar. 30, 2007  (JP) ............... 2007-094781
Jan. 10, 2008  (JP) ............... 2008-003148

(51) Int. Cl.
*G03F 7/004*  (2006.01)
*G03F 7/30*  (2006.01)

(52) U.S. Cl. ............. 430/270.1; 430/326; 430/905; 430/910

(58) Field of Classification Search ............ 430/270.1, 430/326, 905, 910
See application file for complete search history.

(56) References Cited

U.S. PATENT DOCUMENTS

| 4,491,628 A | 1/1985 | Ito et al. | |
| 2007/0218406 A1* | 9/2007 | Mizutani et al. | 430/270.1 |
| 2008/0081289 A1* | 4/2008 | Nishiyama et al. | 430/285.1 |

FOREIGN PATENT DOCUMENTS

| JP | 5-249682 A | 9/1993 |
| JP | 9-211866 A | 8/1997 |
| JP | 2000-352822 A | 12/2000 |
| JP | 2002-49156 A | 2/2002 |
| JP | 2004-302434 A | 10/2004 |
| JP | 2005-352337 A | 12/2005 |
| WO | 96/27584 A1 | 9/1996 |

* cited by examiner

*Primary Examiner*—John S Chu
(74) *Attorney, Agent, or Firm*—Sughrue Mion, PLLC

(57) ABSTRACT

A resist composition includes: (A) a resin that includes: a repeating unit represented by a following formula (I), and a repeating unit represented by a following formula (II); and (B) a compound capable of generating an acid upon irradiation with an actinic ray or radiation:

$$\text{(I)} \quad -(CH_2-\underset{\underset{R_a}{|}}{\underset{|}{\overset{A}{\underset{|}{C}}}}-\overset{|}{\underset{|}{CO_2}})-$$

$$\text{(II)}$$

wherein the variables in the formulae are defined in the specification.

19 Claims, No Drawings

RESIST COMPOSITION AND PATTERN FORMATION METHOD USING THE SAME

BACKGROUND OF THE INVENTION

1. Field of the Invention

The present invention relates to a resist composition used suitably in ultramicrolithography and other photofabrication processes for producing VLSI circuits, high-capacity microchips and the like, and further relates to a pattern formation method using such a resist composition. More specifically, the invention is concerned with a resist composition capable of forming superfine patterns through application of KrF excimer laser light, electron beams, EUV rays or the like, and with a pattern forming method using such a resist composition. In other words, the invention relates to a resist composition and a pattern formation method using this composition, which are suitable for use in super minute patterning of semiconductor elements by means of KrF excimer laser light, electron beams or EUV rays.

2. Description of the Related Art

In fabrication processes of semiconductor devices, such as ICs and LSI circuits, fine patterning by lithography using photoresist compositions has so far been carried out. With recent increase in packing densities of IC chips, formation of super minute patters in the submicron or quarter-micron region has come to be required; consequently, there has been a trend for the exposure wavelengths to be made shorter, from the g-ray to the i-ray and further to KrF excimer laser light. Besides using KrF laser light, development of lithography using electron beams, X-rays or EUV rays is also being pursued at present.

Lithography using electron beams or EUV rays is ranked as the next generation or after-the-next generation of pattern formation technology, and high-sensitivity, high-resolution resists suitable for such lithography are being expected. Although enhancement of sensitivity is a very important problem in aiming reduction of a wafer processing time in particular, pursuit of increase in sensitivity of positive-working resist for electron-beam or EUV use causes not only lowering of resolution but also degradation in line width roughness (LWR). Therefore, development of resist satisfying these properties at the same time is intensely to be desired. Since high sensitivity and high resolution bear a tradeoff relationship to satisfactory LWR, the problem of how to satisfy them at the same time becomes highly important.

In lithography using KrF laser light, as in the above case, simultaneous attainment of high sensitivity, high resolution and satisfactory LWR is a significant challenge, and besides, there occur problems of standing waves and line-width swings (abbreviated to swings or SW) resulting from variations in thickness of resist film on a highly reflective substrate typifying an ion implantation process. In the case of using a highly reflective substrate, there is a trend for swings resulting from variations in resist film thickness to become wide when the resist has a high transmittance, and it is known that they are reduced by introduction of dyes. However, the introduction of dyes causes lowering of resolution and degradation in LWR, and besides, there may be cases where a baking plate is polluted with dyes subliming at the baking step in the process of resist film formation. So, how to resolve those problems at the same time is of great significance.

As resists suitable for the lithographic processes using KrF excimer laser light, electron beams or EUV rays, chemical amplification resists utilizing acid catalysts are chiefly used from the viewpoint of increasing the sensitivity. As to those of positive-working type, chemical amplification resist compositions containing phenolic polymers having properties of being insoluble or slightly soluble in alkali developers and turning soluble in alkali developers under the action of acids (hereafter abbreviated as "acid-decomposable phenolic resin") and acid generators as main components are effectively used.

One example of chemical amplification positive-working resist compositions in the nascent stages, which each contain a photo-acid generator and a resin protected by acid-decomposable groups, is disclosed in U.S. Pat. No. 4,491,628. Such a chemical amplification positive-working resist composition is a pattern-forming material which can form patterns on a substrate by undergoing exposure to radiation, such as far-ultraviolet rays, to produce an acid in exposed portions and causing the acid-catalyzed reaction therein to bring about variations in developer solubility between the portions irradiated and unirradiated with the active radiation.

Various positive-working resist compositions of the type which contain resins protected by acid-decomposable groups have so far been known. For example, the resist composition using a poly(hydroxystyrene) resin protected by alkoxy (acetal) groups is disclosed in JP-A-5-249682, the resist composition using a poly(hydroxystyrene) resin protected by two different kinds of acid-decomposable groups in JP-A-9-211866, the resist composition using a resin protected by acetal groups having heterocyclic groups at their respective ends via linkage groups in JP-A-2000-352822, the resist composition using a poly(hydroxystyrene) resin protected by two different kinds of acetal groups in JP-A-2002-49156, the resist composition using an anthracene ring-containing substance as dye in JP-A-2004-302434, and the hydroxystyrene units having substituents in JP-A-2005-352337, but in actuality none of those combinations can satisfy all the requirements described above at the same time, namely all of high sensitivity, high resolution and satisfactory LWR in the super minute region, and reductions in standing waves and swings resulting from variations in resist film thickness on a highly reflective substrate, which is representative of the KrF ion implantation process.

SUMMARY OF THE INVENTION

The invention provides a resist composition that can ensure not only high sensitivity, high resolution and satisfactory LWR but also, in KrF excimer laser lithography, reductions of standing waves and swings resulting from variations in thickness of resist film on a highly reflective substrate, and the invention also provides a pattern formation method using the aforesaid resist composition.

The invention includes the following aspects.

<1> A resist composition comprising:

(A) a resin that comprises:

a repeating unit represented by a following formula (I), and a repeating unit represented by a following formula (II); and (B) a compound capable of generating an acid upon irradiation with an actinic ray or radiation:

-continued

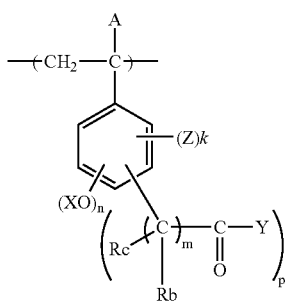
(II)

wherein

A represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group, Ra represents a group capable of leaving by the action of an acid or a group capable of decomposing by the action of an acid, each of Rb and Rc independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group, X represents a hydrogen atom or an organic group, Y represents a hydrogen atom or an organic group, Z represents a substituent, p represents an integer of 1 to 4, n represents an integer of 1 to 4 and k represents an integer of 0 to 3, provided that $2 \leq p+n+k \leq 5$, when p is from 2 to 4, each Y, each Rb and each Rc may be the same as or different from every other Y, every other Rb and every other Rc, respectively, when n is from 2 to 4, each X may be the same as or different from every other X, when k is 2 or 3, each Z may be the same as or different from every other Z, and m represents an integer of 0 to 10.

<2> The resist composition as described in <1>, wherein m in the formula (II) represents 0.

<3> The resist composition as described in <1> or <2>, wherein Y in the formula (II) represents an aryl group.

<4> The resist composition as described in any one of <1> to <3>, wherein Ra in the formula (I) represents a group comprising a cyclic carbon structure.

<5> The resist composition as described in <4>, wherein Ra in the formula (I) is represented by a following formula (IRa);

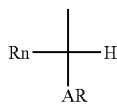
(IRa)

wherein

AR represents an aryl group, and

Rn represents an alkyl group, a cycloalkyl group or an aryl group.

<6> The resist composition as described in any one of <1> to <5>, wherein the compound (B) comprises at least one kind of onium salt.

<7> The resist composition as described in <6>, wherein the compound (B) comprises at least one kind of compound represented by a following formula (ZI) or (ZII);

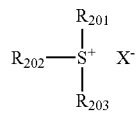
ZI

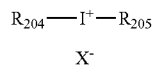
ZII wherein each of $R_{201}$ to $R_{205}$ independently represents an aliphatic hydrocarbon group or an aromatic hydrocarbon group, any two of $R_{201}$ to $R_{203}$ may combine with each other to form a ring, $R_{204}$ and $R_{205}$ may combine with each other to form a ring, and $X^-$ represents any of following anions (AN1), (AN3) and (AN4):

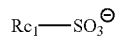
AN1

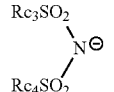
AN3

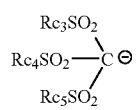
AN4 wherein each $R_{c1}$ and $R_{c3}$ to $R_{c5}$ independently represents an organic group, and $R_{c3}$ and $R_{c4}$ may combine with each other to form a ring.

<8> A method for forming patterns, comprising:

forming a resist film from the resist composition as described in any one of <1> to <7>, exposing the formed resist film, and developing the exposed resist film.

Preferred embodiments of the invention are the following.

<9> The resist composition as described in any one of <1> to <7>, wherein the resin (A) further comprises a repeating unit represented by a following formula (III):

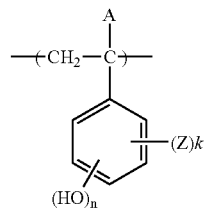
(III)

wherein

Z represents a substituent, n is an integer of 1 to 5 and k is integer of 0 to 4, provided that $1 \leq n+k \leq 5$, and when k is from 2 to 4, each Z may be the same as or different from every other Z.

<10> The resist composition as described in any one of <1> to <7>, wherein the formula (II) is represented by a following formula (IIa):

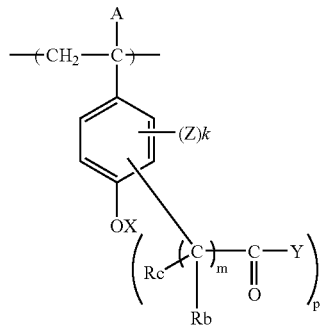

(IIa)

wherein

A, X, Y, Z, Rb, Rc, k, m and p have the same meanings as those in the formula (II), respectively.

<11> The resist composition as described in <10>, wherein the formula (IIa) is represented by a following formula (IIb):

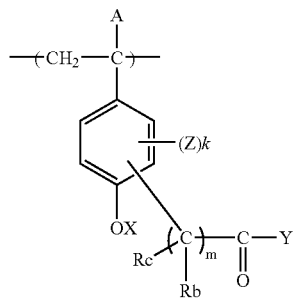

(IIb)

wherein

A, X, Y, Z, Rb, Rc, k and m have the same meanings as those in the formula (IIa), respectively.

<12> The resist composition as described in <11>, wherein the formula (IIb) is represented by a following formula (IIc):

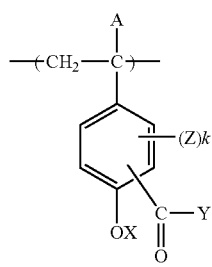

(IIc)

wherein

A, X, Y, Z and k have the same meanings as those in the formula (IIb), respectively.

<13> The resist composition as described in <11>, wherein the formula (IIb) is represented by a following formula (IId):

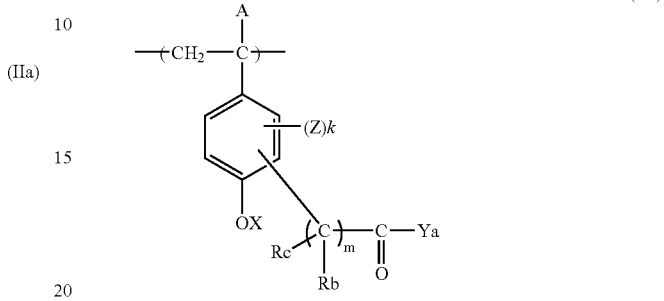

(IId)

wherein

A, X, Z, Rb, Rc, k and m have the same meanings as those in the formula (IIb), and Ya represents an aryl group.

<14> The resist composition as described in any one of <1> to <7> and <9> to <13>, further comprising:

(C) a basic compound.

<15> The resist composition as described in any one of <1> to <7> and <9> to <14>, further comprising:

(D) a surfactant.

<16> The resist composition as described in any one of <1> to <7> and <9> to <15>, further comprising:

(E) a solvent.

<17> The resist composition as described in <16>, wherein the solvent (E) comprises propylene glycol monomethyl ether acetate, <18> The resist composition as described in <17>, wherein the solvent (E) further comprises at least one solvent selected from the group consisting of propylene glycol monomethyl ether, ethyl lactate, butyl acetate, ethoxyethyl propionate and methyl amyl ketone.

<19> The resist composition as described in any one of <1> to <7> and <9> to <18>, which is exposed by irradiation with KrF excimer laser, electron beams, X-rays or EUV.

<20> A method for forming patterns, comprising:

forming a resist film from the resist composition as described in any one of <9> to <19>, exposing the formed resist film, and developing the exposed resist film.

DETAILED DESCRIPTION OF THE INVENTION

The invention is described below in detail.

With respect to representation of groups (atomic groups) in the present specification, when neither the word "substituted" nor the word "unsubstituted" is written, the groups are intended to include both substituted and unsubstituted ones. For instance, the term "an alkyl group" includes not only an alkyl group having no substituent (an unsubstituted alkyl group) but also an alkyl group having a substituent (a substituted alkyl group).

(A) Resin Having Repeating Units Represented by Formula (I) and Repeating Units Represented by Formula (II)

The present resist composition contains a resin having repeating units represented by the following formula (I) and repeating units represented by the following formula (II) (hereafter referred to as "a resin of Component (A)" or "Resin (A)" too).

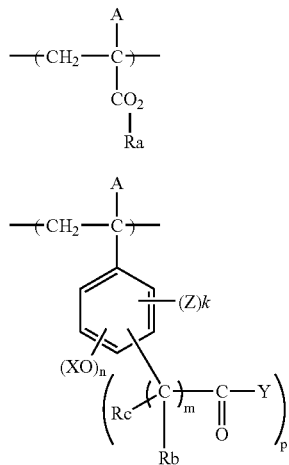

In the formulae (I) and (II), A represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

Ra represents a group capable of leaving the repeating unit under action of an acid or a group capable of decomposing by the action of an acid.

each of Rb and Rc independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

X represents a hydrogen atom or an organic group.

Y represents a hydrogen atom or an organic group.

Z represents a substituent.

p is an integer of 1 to 4, n is an integer of 1 to 4 and k is an integer of 0 to 3, provided that $2 \leq p+n+k \leq 5$.

When p is from 2 to 4, each Y, each Rb and each Rc may be the same as or different from every other Y, every other Rb and every other Rc, respectively.

When n is from 2 to 4, each X may be the same as or different from every other X.

When k is 2 or 3, the two or three Zs may be the same or different.

m represents an integer of 0 to 10.

An example of the group capable of leaving the repeating unit under action of an acid, which is represented by Ra in the formula (I), is $-C(R_{36})(R_{37})(R_{38})$.

In the above formula, $R_{36}$ to $R_{38}$ independently represent a hydrogen atom, an alkyl group, a cycloalkyl group, an aryl group, an aralkyl group or an alkenyl group. $R_{36}$ and $R_{37}$ may combine with each other to form a ring.

The group capable of leaving the repeating unit under action of an acid, which is represented by Ra, is preferably a hydrocarbon group.

Such a hydrocarbon group is preferably a group having an alkyl moiety or a group having a moiety of cyclic carbon structure (alicyclic or aryl structure), far preferably a group having a moiety of cyclic carbon structure (alicyclic or aryl structure), further preferably a group having an aryl moiety.

The alkyl group in Ra is preferably a straight-chain or branched alkyl group having 1 to 6 carbon atoms, such as a methyl group, an ethyl group, a propyl group, a butyl group or a t-butyl group.

The alicyclic structure in Ra may have a substituent, and it may be a monocyclic or polycyclic structure. Examples of such an alicyclic structure include monocyclic, bicyclic, tricyclic and tetracyclic structures which each have 5 or more carbon atoms. The total number of carbon atoms in each structure is preferably from 6 to 30, particularly preferably from 7 to 25. The hydrocarbon groups having those alicyclic structures may have substituents.

Examples of the alicyclic structures are illustrated below.

(1)

(2)

(3)

(4)

(5)

(6)

(7)

(8)

(9)

(10)

(11)

-continued
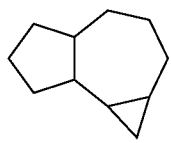
(12)
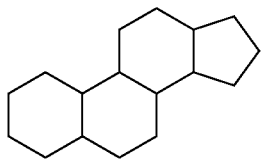
(13)
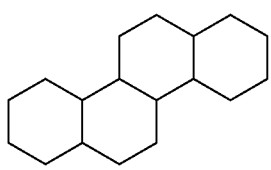
(14)
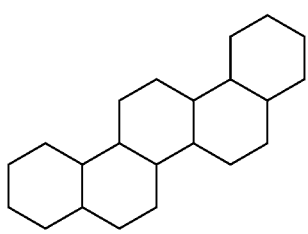
(15)
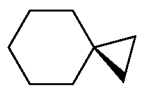
(16)
(17)
(18)
(19)
(20)
(21)
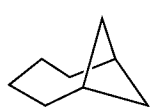
(22)
(23)
-continued
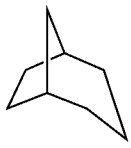
(24)
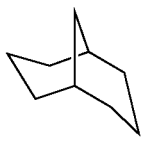
(25)
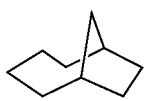
(26)
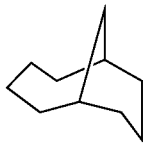
(27)
(28)
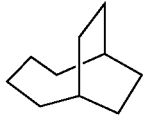
(29)
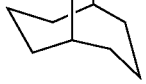
(30)
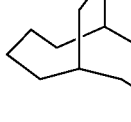
(31)
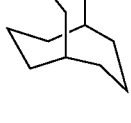
(32)
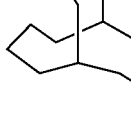
(33)
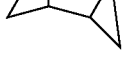
(34)

-continued

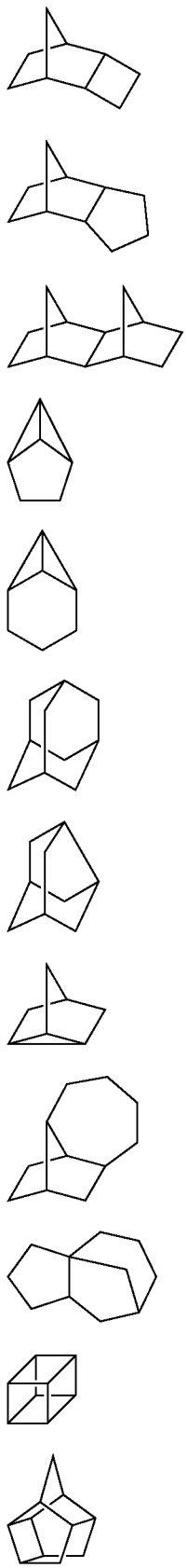

(35)
(36)
(37)
(38)
(39)
(40)
(41)
(42)
(43)
(44)
(45)
(46)

-continued

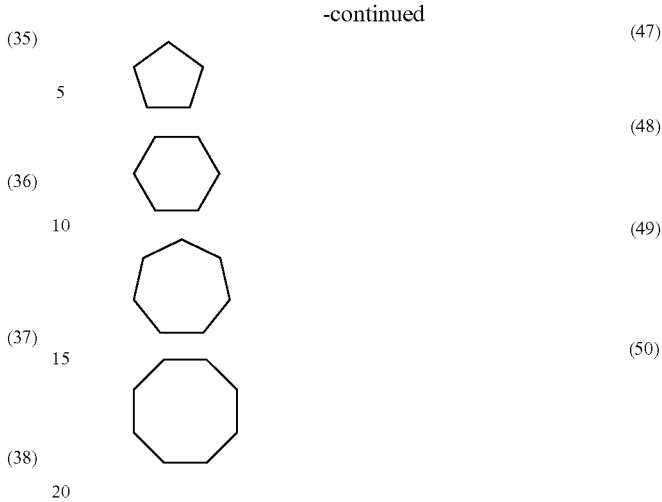

(47)
(48)
(49)
(50)

Examples of a group having an alicyclic structure (referred to as "an alicyclic group" too) suitable for use in the invention include an adamantyl group, a noradamantyl group, a decaline residue, a tricyclodecanyl group, a tetracyclododecanyl group, a norbornyl group, a cedrol residue, a cyclohexyl group, a cycloheptyl group, a cyclooctyl group, a cyclodecanyl group and a cyclododecanyl group. Of these groups, an adamantyl group, a decaline group, a norbornyl group, a cedrol residue, a cyclohexyl group, a cycloheptyl group, a cyclooctyl group, a cyclodecanyl group and a cyclododecanyl group are preferred over the others.

Examples of substituents those alicyclic groups can have include alkyl groups, halogen atoms, a hydroxyl group, alkoxy groups, a carboxyl group and alkoxycarbonyl groups. The alkyl groups are preferably lower alkyl groups, such as a methyl group, an ethyl group, a propyl group, an isopropyl group and a butyl group, and they are far preferably a methyl group, an ethyl group, a propyl group and an isopropyl group. The alkoxy groups are preferably lower alkoxy groups containing 1 to 4 carbon atoms, such as a methoxy group, an ethoxy group, a propoxy group and a butoxy group. Examples of substituents those alkyl and alkoxy groups may have include a hydroxyl group, halogen atoms and alkoxy groups (preferably containing 1 to 4 carbon atoms).

Examples of substituents the groups recited above may further have include a hydroxyl group, halogen atoms (fluorine, chlorine, bromine and iodine), a nitro group, a cyano group, the alkyl groups recited above, alkoxy groups such as a methoxy group, an ethoxy group, a hydroxyethoxy group, a propoxy group, a hydroxypropoxy group, an n-butoxy group, an isobutoxy group, a sec-butoxy group and a t-butoxy group, alkoxycarbonyl groups such as a methoxycarbonyl group and an ethoxycarbonyl group, aralkyl groups such as a benzyl group, a phenethyl group and a cumyl group, aralkyloxy groups, acyl groups such as a formyl group, an acetyl group, a butyryl group, a benzoyl group, a cinnamoyl group and a valeryl group, acyloxy groups such as a butyryloxy group, alkenyl groups, alkenyloxy groups such as a vinyloxy group, a propenyloxy group, an allyloxy group and a butenyloxy group, aryl groups, aryloxy groups such as a phenoxy group, and aryloxycarbonyl groups such as a benzoyloxy group.

The substituent the alicyclic group in Ra may have is preferably an alkyl group containing 1 to 20 carbon atoms, an aryl group containing 6 to 20 carbon atoms, or an aralkyl group containing 7 to 20 carbon atoms. These substituents each may further have a substituent.

The group having an aryl structure in Ra is preferably an aryl group containing 6 to 14 carbon atoms, such as a phenyl group, a xylyl group, a tolyl group, a cumenyl group, a naphthyl group or an anthryl group.

The group represented by Ra, which can leave the repeating unit under action of an acid, is preferably a group having an aryl group, for preferably a group represented by the following formula (IRa).

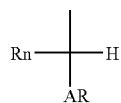

(IRa)

In the formula (IRa), AR represents an aryl group, and Rn represents an alkyl group, a cycloalkyl group or an aryl group.

The alkyl group of Rn in the formula (IRa) may have a substituent, and may be either of straight-chain and branched ones. The straight-chain alkyl group is preferably a group containing 1 to 30 carbon atoms, and far preferably a group containing 1 to 20 carbon atoms, with examples including a methyl group, an ethyl group, an n-propyl group, an n-butyl group, a sec-butyl group, a t-butyl group, an n-pentyl group, an n-hexyl group, an n-heptyl group, an n-octyl group, an n-nonyl group and an n-decanyl group. The branched alkyl group is preferably a group containing 3 to 30 carbon atoms, far preferably a group containing 3 to 20 carbon atoms, with examples including an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group and a t-decyl group. Examples of substituents those groups may suitably have include alkoxy groups, a hydroxyl group, halogen atoms, a nitro group, acyl groups, acyloxy groups, acylamino groups, sulfonylamino groups, alkylthio groups, arylthio groups, aralkylthio groups, and heterocyclic ring residues such as a thiophenecarbonyloxy group, a thiophenemethylcarbonyloxy groups and a pyrrolidone residue. Of those substituted alkyl groups, $CF_3$, alkyloxycarbonylmethyl groups, alkylcarbonyloxymethyl groups, a hydroxymethyl group and alkoxymethyl groups are particularly suitable.

Examples of a cycloalkyl group of Rn include the same groups as the examples of a cycloalkyl group of Ra include.

The aryl group of AR and Rn each is preferably an aryl group containing 6 to 14 carbon atoms, with examples including a phenyl group, a xylyl group, a tolyl group, a cumenyl group, a naphthyl group and an anthryl group, which each may have one or more substituents. Examples of such substituents include straight-chain or branched alkyl groups preferably having 1 to 20 carbon atoms, such as a methyl group, an ethyl group, a propyl group, an isopropyl group, an n-butyl group, an isobutyl group, a t-butyl group, a pentyl group, a cyclopentyl group, a hexyl group, a cyclohexyl group, an octyl group and a dodecyl group, alkoxy groups, a hydroxyl group, halogen atoms, a nitro group, acyl groups, acyloxy groups, acylamino groups, sulfonylamino groups, alkylthio groups, arylthio groups, aralkylthio groups and hetero ring residues such as a thiophenecarbonyloxy group, a thiophenemethylcarbonyloxy group and a pyrrolidone residue. Of these substituents, straight-chain or branched alkyl groups having 1 to 5 carbon atoms are preferred over the others in point of resolution. The aryl group of AR and Rn each is far preferably a phenyl group or a p-methylphenyl group.

Examples of an alkyl, cycloalkyl or aryl group which A can represent include the same groups as the examples of an alkyl, cycloalkyl or aryl group of Rn include respectively.

Examples of a halogen atom which A can represent include a fluorine atom, a chlorine atom, a bromine atom and an iodine atom, and the halogen atom of A is preferably a fluorine atom.

The alkoxy group of A may have a substituent, and examples thereof include alkoxy groups containing 1 to 8 carbon atoms, such as a methoxy group, an ethoxy group, a propoxy group, a butoxy group, a pentyloxy group, a hexyloxy group and a cyclohexyloxy group.

Examples of the alkyl moiety in the alkyloxycarbonyl or alkylcarbonyloxy group of A include the same groups as examples of the alkyl group of Rn include.

Each of the acyl group of A and the acyl moiety of the acyloxy group of A may have a substituent, and it may be an acyl group containing 2 to 8 carbon atoms. Examples of such an acyl group include a formyl group, an acetyl group, a propanoyl group, a butanoyl group, a pivaloyl group and a benzoyl group.

The aralkyl group of A is preferably an aralkyl group containing 7 to 12 carbon atoms, with examples including a benzyl group, a phenethyl group and a naphthylmethyl group.

The number of carbon atoms in A is preferably 16 or below, and a hydrogen atom or a methyl group is more suitable as A.

Examples of a group capable of decomposing by the action of an acid (referred to as "acid-decomposable group" too) which Ra can represent include an alkyl group (preferably containing 1 to 15 carbon atoms) having an acid-decomposable moiety, a cycloalkyl group (preferably containing 3 to 15 carbon atoms) having an acid-decomposable moiety and an aryl group (preferably containing 6 to 15 carbon atoms) having an acid-decomposable moiety.

Examples of such an acid-decomposable moiety include alkali-soluble groups, such as a carboxyl group, a phenolic hydroxyl group, a sulfonic acid group and a thiol group, whose hydrogen atoms are protected by groups eliminable under action of an acid.

Examples of the groups eliminable under action of an acid include —$C(R_{36})(R_{37})(R_{38})$, —$C(R_{36})(R_{37})(OR_{39})$, —C(=O)—O—$C(R_{36})(R_{37})(R_{38})$, —$C(R_{01})(R_{02})(OR_{39})$ and —$C(R_{01})(R_{02})$—C(=O)—O—$C(R_{36})(R_{37})(R_{38})$.

In the above formulae, $R_{36}$ to $R_{39}$ independently represent an alkyl group, a cycloalkyl group, an aryl group, an aralkyl group or an alkenyl group. $R_{36}$ and $R_{37}$ may combine with each other to form a ring.

$R_{01}$ and $R_{02}$ independently represent a hydrogen atom, an alkyl group, a cycloalkyl group, an aryl group, an aralkyl group or an alkenyl group.

Examples of repeating units represented by the formula (I) are illustrated below, but the invention should not be construed as being limited to these examples.

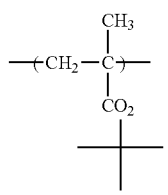

(I-1)

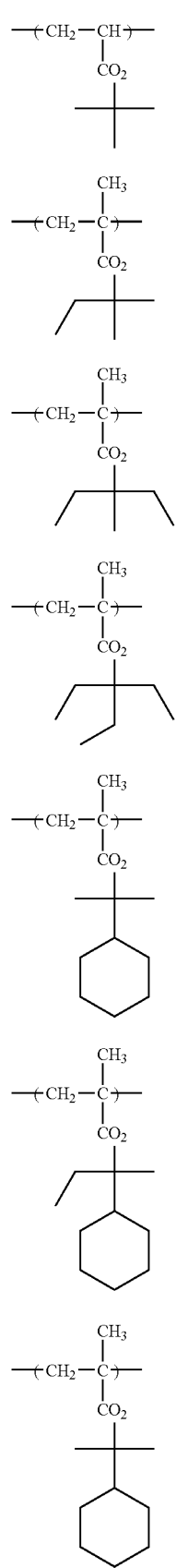
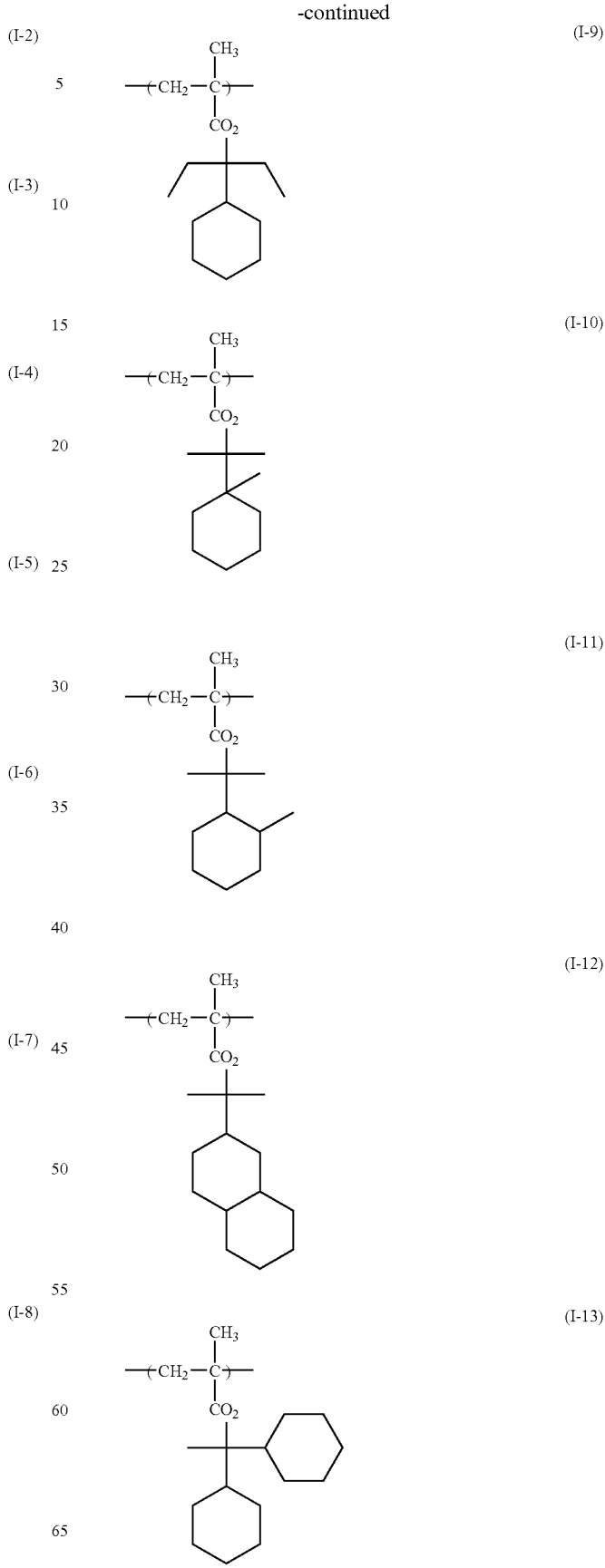

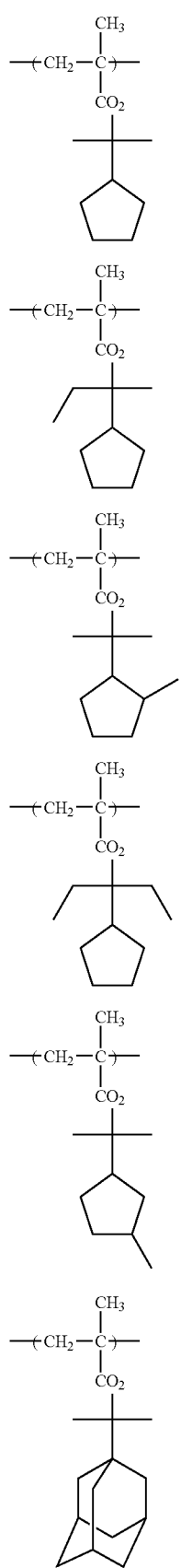
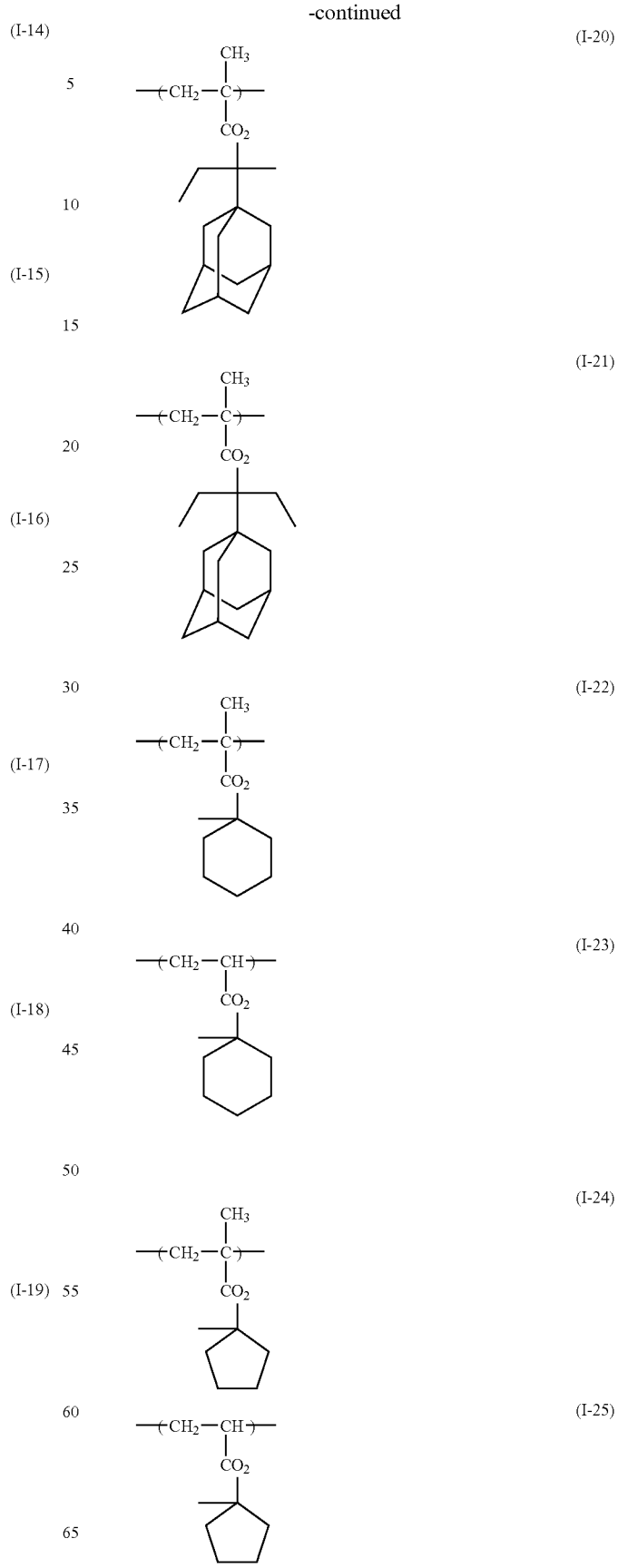

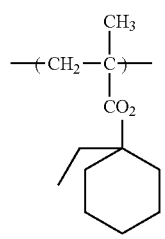 (I-26)
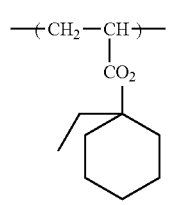 (I-27)
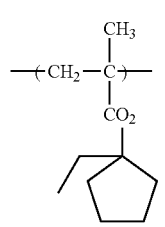 (I-28)
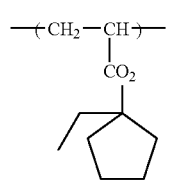 (I-29)
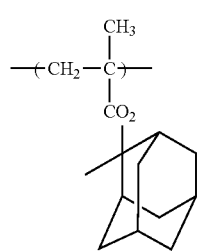 (I-30)
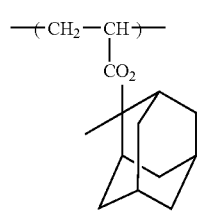 (I-31)
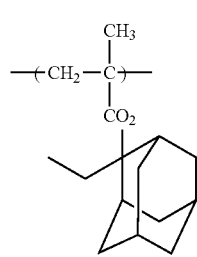 (I-32)
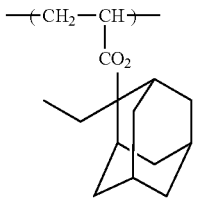 (I-33)
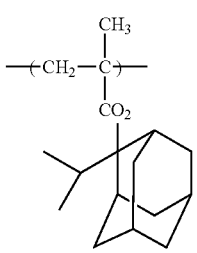 (I-34)
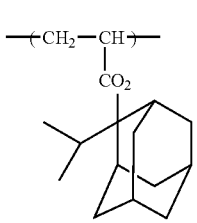 (I-35)
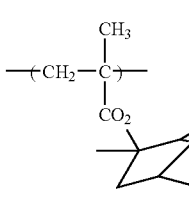 (I-36)
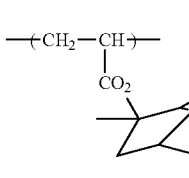 (I-37)
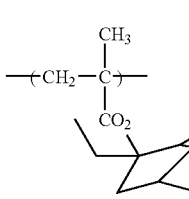 (I-38)
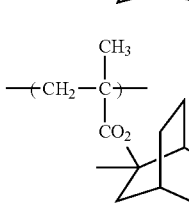 (I-39)
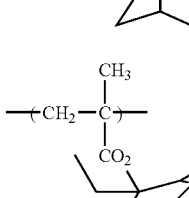 (I-40)

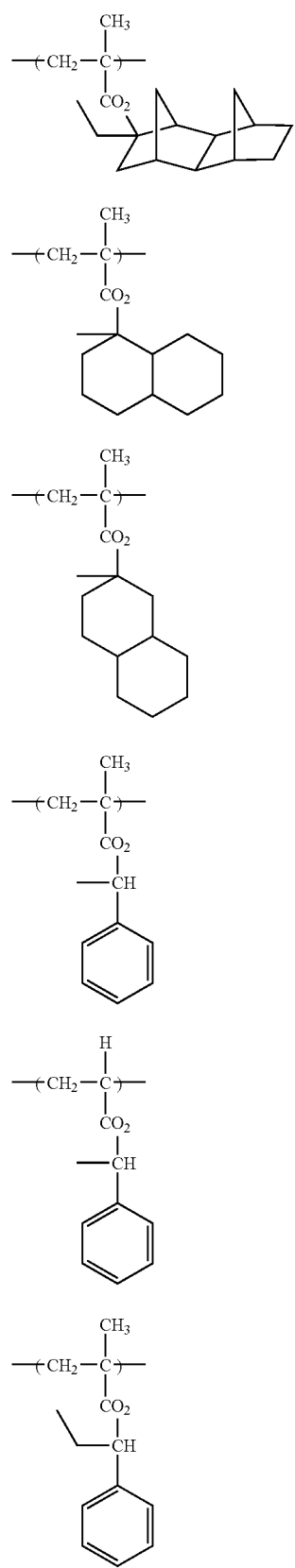
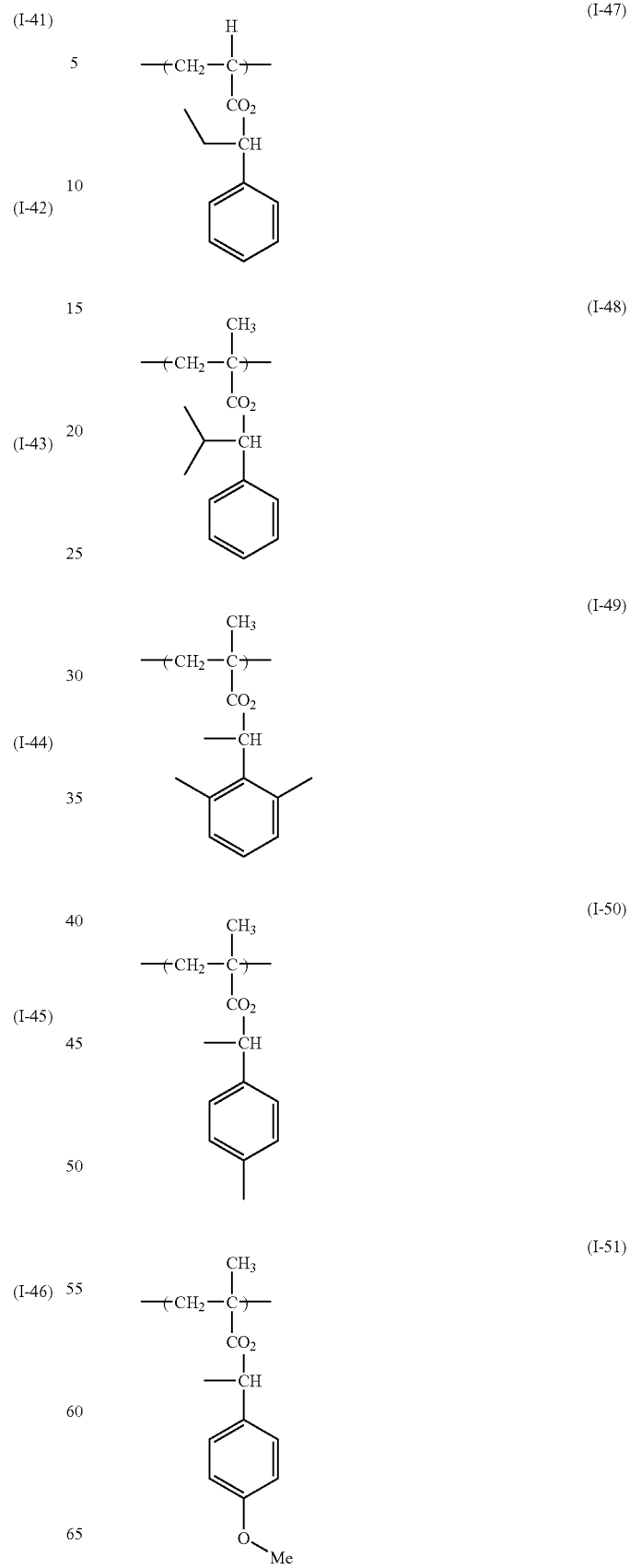

-continued (I-52) 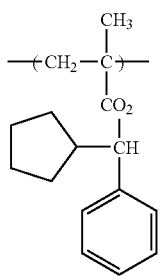

(I-53) 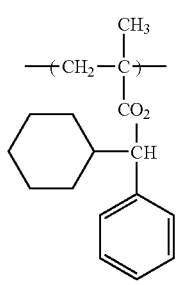

(I-54) 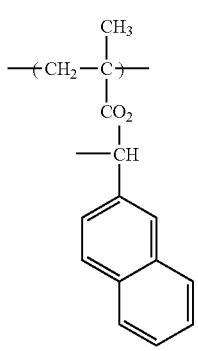

(I-55) 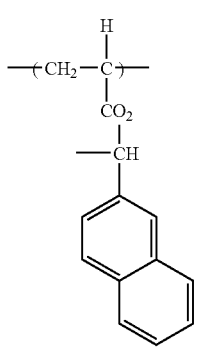

(I-56) 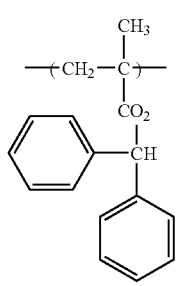

-continued (I-57) 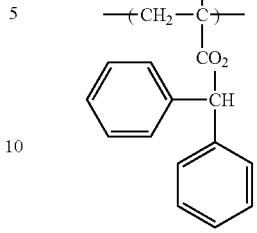

In the formula (II) A has the same meaning as A in the formula (I).

The substituent represented by Z can be any of substituents as far as they can generally replace hydrogen atoms of the benzene in the structure represented by the formula (II).

Examples of the substituent Z include a halogen atom, an all group, an alicyclic group, an aryl group, an alkoxy group, an acyl group, —OC(=O)Rb, —OC(=O)ORb, —C(=O)ORb, —C(=O)N(Rc)Rb, —N(Rc)C(=O)Rb, —N(Rc)C(=O)ORb, —N(Rc)SO$_2$Rb, —SRb, —SO$_2$Rb, —SO$_3$Rb and —SO$_2$N(Rc)Rb. In these formulae, each of Rb and Rc independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group. Examples of each of the alkyl group, the alkoxy group, the halogen atom, the acyl group, the acyloxy group, the cycloalkyl group, the aryl group, the alkyloxycarbonyl group, the alkylcarbonyloxy group and the aralkyl group which Rb and Rc each can represent include the same groups as those of A in the formula (I) include.

Examples of the alkyl group of Z include the same groups as those of Rn in the formula (IRa) include.

Examples of the alicyclic group of Z include the same groups as those of Ra in the formula (I) include.

Examples of the alkoxy group of Z include the same groups as those of A in the formula (I) include.

Examples of the aryl group of Z include the same groups as those of Rn in the formula (IRa) include.

Examples of the acyl group of Z include the same groups as those of A in the formula (I) include.

As to the Rb and Rc each in the formula (II), examples of each of the alkyl group, the alkoxy group, the halogen atom, the acyl group, the acyloxy group, the cycloalkyl group, the aryl group, the alkyloxycarbonyl group, the alkylcarbonyloxy group and the aralkyl group include the same groups as those of A in the formula (I) include.

The organic group of each of X and Y in the formula (II) preferably contains 1 to 40 carbon atoms, and it may be a group eliminable under action of an acid (referred to as "an acid-eliminable group" too) or a group noneliminable under action of an acid (referred to as "an acid-noneliminable group" too).

Examples of such an acid-noneliminable group are the same as the acid-noneliminable organic groups among examples of the substituent Z.

Such acid-noneliminable organic groups include an alkyl group, a cycloalkyl group, an alkenyl group, an aryl group, an alkyloxy group (with the exception of —O-tert-alkyl), an acyl group, a cycloalkyloxy group, an alkenyloxy group, an aryloxy group, an alkylcarbonyloxy group, an alkylamidomethyloxy group, an alkylamido group, an arylamidomethyl group and an arylamido group.

Of these acid-noneliminable groups, an acyl group, an alkylcarbonyloxy group, an alkyloxy group, a cycloalkyloxy group, an aryloxy group, an alkylamidoxy group and alkylamido group, especially an acyl group, an alkylcarbonyloxy group, an alkyloxy group, a cycloalkyloxy group and an aryloxy group, are preferred over the others.

As to the acid-noneliminable groups, the alkyl group is preferably an alkyl group containing 1 to 4 carbon atoms, such as a methyl group, an ethyl group, a propyl group, an n-butyl group, a sec-butyl group or a t-butyl group; the cycloalkyl group is preferably a cycloalkyl group containing 3 to 10 carbon atoms, such as a cyclopropyl group, a cyclobutyl group, a cyclohexyl group or an adamantyl group; the alkenyl group is preferably an alkenyl group containing 2 to 4 carbon atoms, such as a vinyl group, a propenyl group, an allyl group or a butenyl group; the aryl group is preferably an aryl group containing 6 to 14 carbon atoms, such as a phenyl group, a xylyl group, a tolyl group, a cumenyl group, a naphthyl group or an anthryl group; and the alkoxy group is preferably an alkoxy group containing 1 to 4 carbon atoms, such as a methoxy group, an ethoxy group, a hydroxyethoxy group, a propoxy group, a hydroxypropoxy group, an n-butoxy group, an isobutoxy group or a sec-butoxy group.

Examples of the acid-eliminable group of X include —C($R_{11a}$)($R_{12a}$)($R_{13a}$), —C($R_{14a}$)($R_{15a}$)(O$R_{16a}$) and —CO—OC($R_{11a}$)($R_{12a}$)($R_{13a}$).

More specifically, when X is an acid-eliminable group, X is eliminated by the action of an acid and a hydroxyl group as an alkali-soluble group is formed on the benzene ring shown in the formula (II).

An example of the acid-eliminable group of Y can be —O—C($R_{11a}$)($R_{12a}$)($R_{13a}$).

$R_{11a}$ to $R_{13a}$ independently represent an alkyl group, a cycloalkyl group, an alkenyl group, an aralkyl group or an aryl group. $R_{14a}$ and $R_{15a}$ independently represent a hydrogen atom or an alkyl group. $R_{16a}$ represents an alkyl group, a cycloalkyl group, an alkenyl group, an aralkyl group or an aryl group. Additionally, any two of $R_{11a}$, $R_{12a}$ and $R_{13a}$ or any two of $R_{14a}$, $R_{15a}$ and $R_{16a}$ may combine with each other to form a ring.

Into X in the formula (II), a group having an acid-decomposable group may also be introduced by modification. The X into which an acid-decomposable group is introduced in this way is, e.g., as follows:

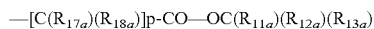

wherein $R_{17a}$ and $R_{18a}$ independently represent a hydrogen atom or an alkyl group, and p represents an integer of 1 to 4.

The repeating units represented by the formula (II) are preferably repeating units represented by the following formula (IIa), far preferably repeating units represented by the following formula (IIb).

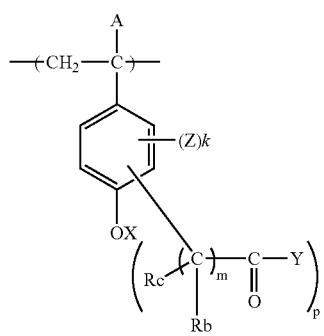

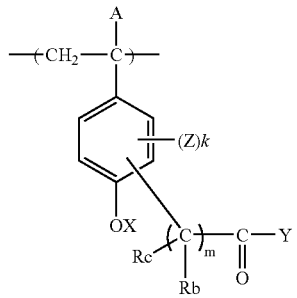

In the formulae (IIa) and (IIb), A, X, Y, Z, Rb, Rc, k, m and p have the same meaning as those in the formula (II), respectively.

The repeating units represented by the formula (IIb) are repeating units having their absorption at a wavelength of 248 nm, and they are preferably repeating units represented by the following formula (IIc) or (IId).

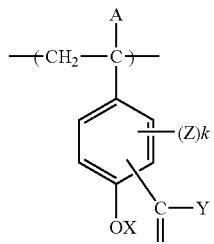

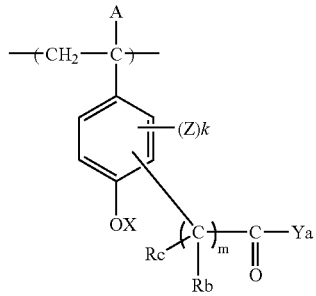

In the formulae (IIc) and (IId), A, X, Y, Z, Rb, Rc, k and m have the same meanings as those in the formula (II), respectively.

Ya represents an aryl group.

Examples of the aryl group of Ya are the same as examples of the aryl group Rn can represent.

Examples of repeating units represented by the formula (II) in the case where X represents a hydrogen atom are illustrated below, but these examples should not be construed as limiting the scope of the invention.

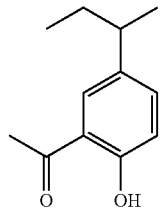

(II-1)

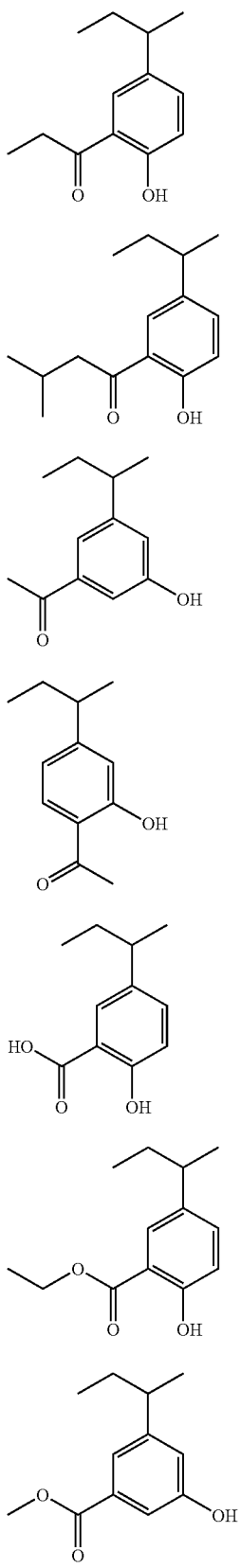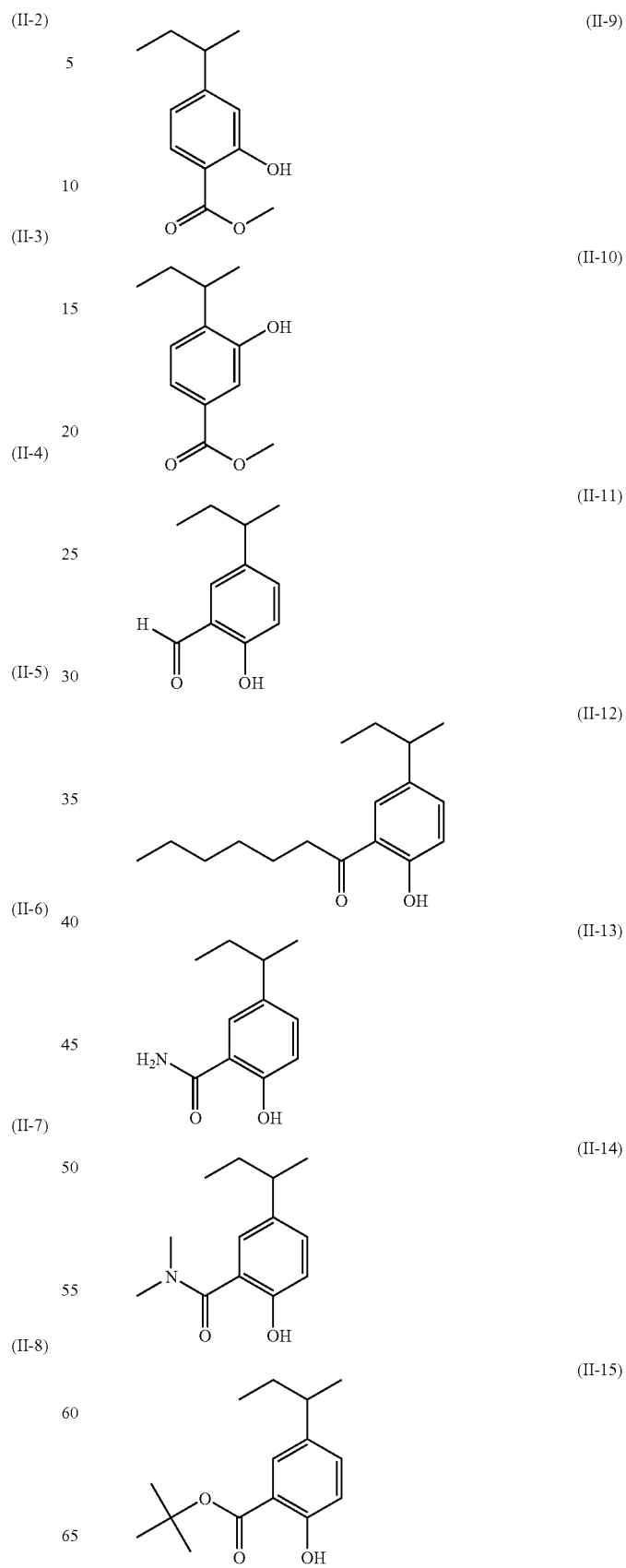

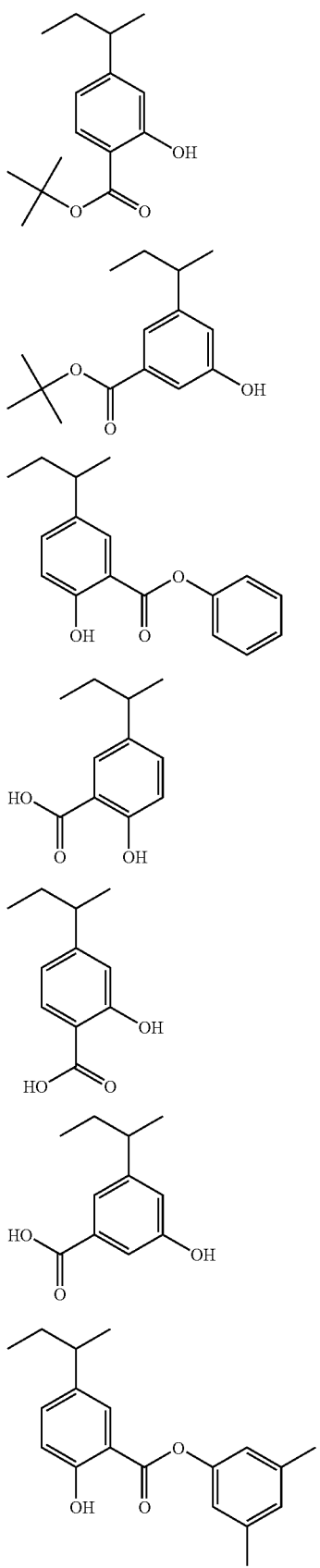
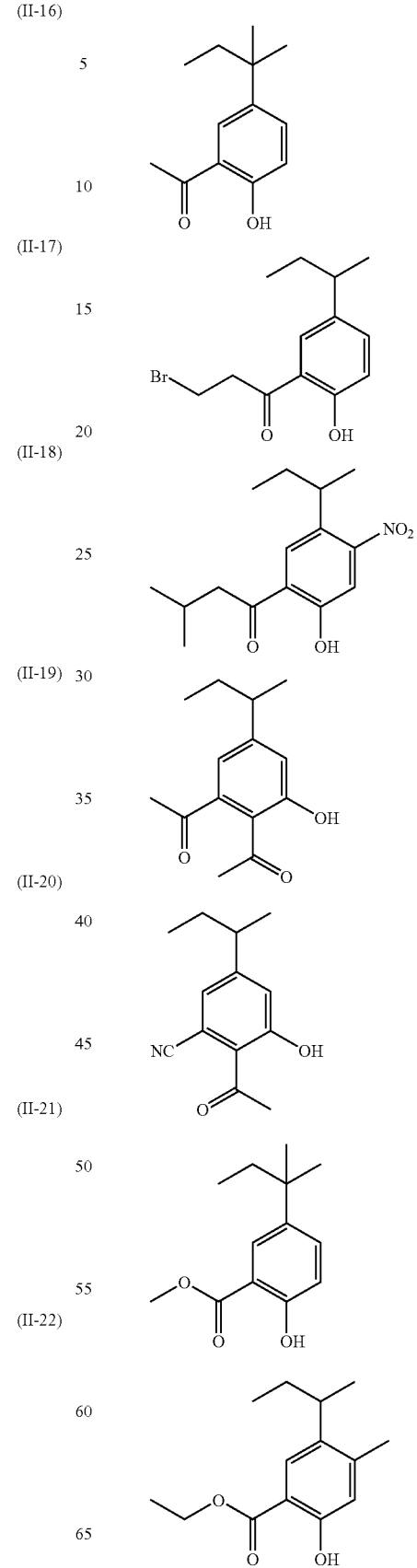

(II-30) 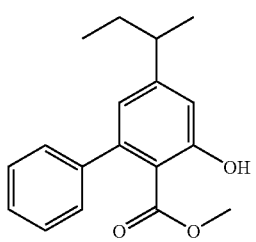
(II-31) 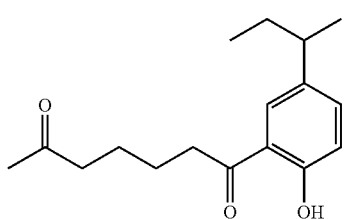
(II-32) 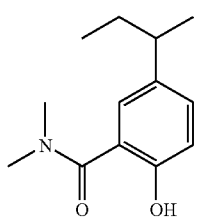
(II-33) 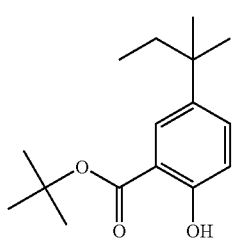
(II-34) 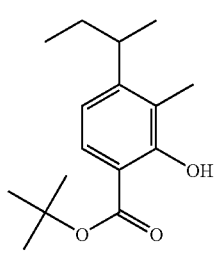
(II-35) 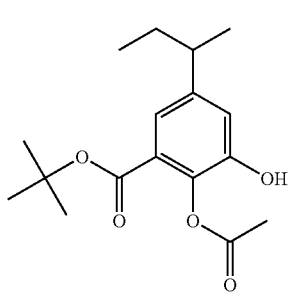
(II-36) 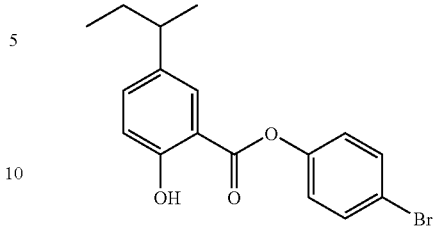
(II-37) 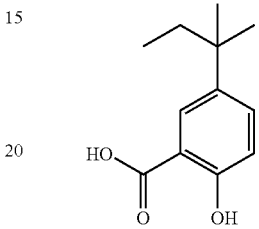
(II-38) 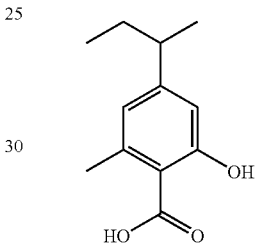
(II-39) 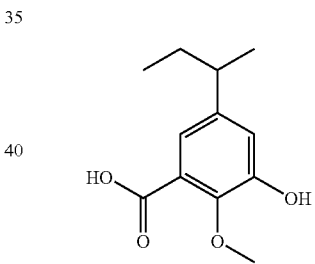
(II-40) 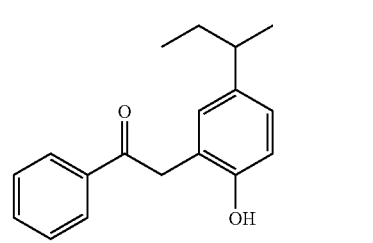
(II-41)

-continued
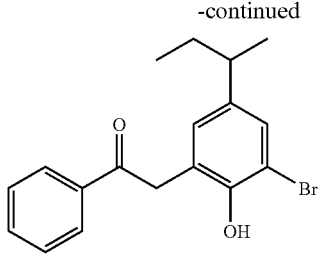
(II-42)
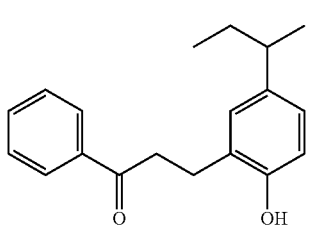
(II-43)
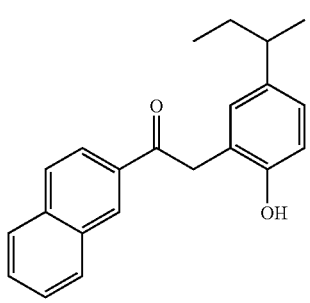
(II-44)
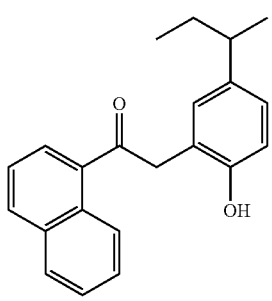
(II-45)
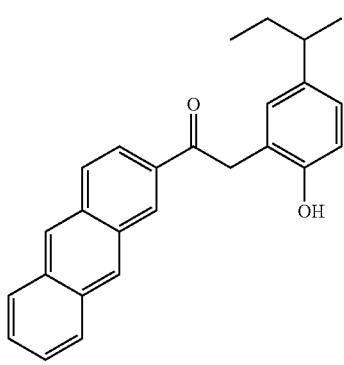
(II-46)
-continued
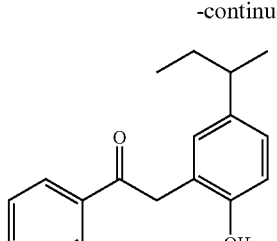
(II-47)
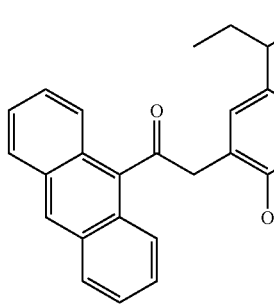
(II-48)
Examples of the acid-eliminable group as X are illustrated below, but these examples should not be construed as limiting the scope of the invention,
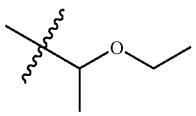
(H-1)
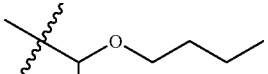
(H-2)
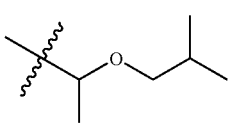
(H-3)
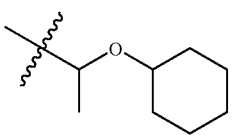
(H-4)
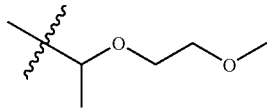
(H-5)
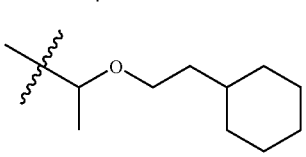
(H-6)

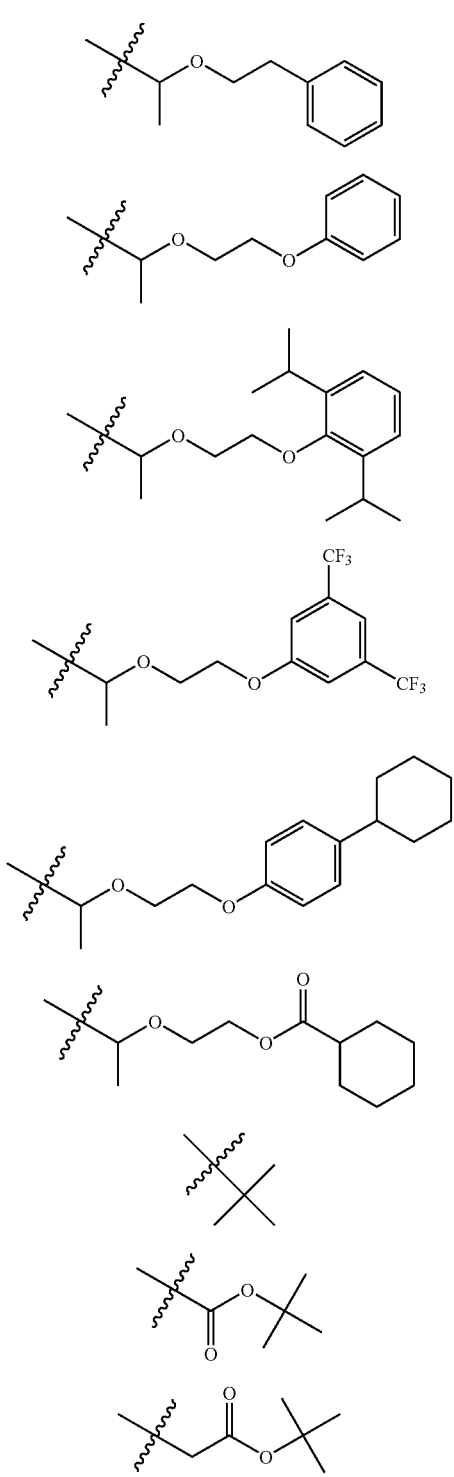

It is preferable that Resin (A) further contains at least one kind of repeating units represented by the following formula (III).

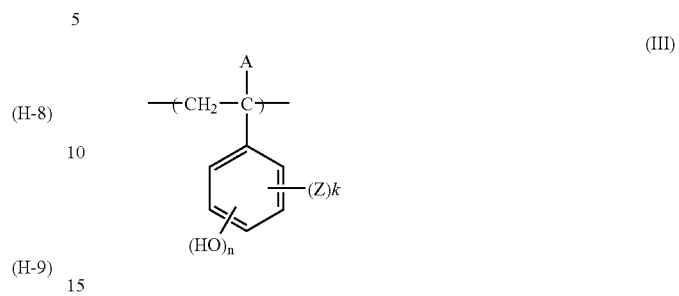

In the formula (III), A represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group. Z represents a substituent. n is an integer of 1 to 5 and k is an integer of 0 to 4, provided that $1 \leqq n+k \leqq 5$. When k is from 2 to 4, the two or more Zs may be the same or different.

The Z in the formula (III) has the same meaning as the Z in the formula (II).

Resin (A) may also be a copolymer including other appropriate comonomers for introducing alkali-soluble groups, such as a carboxyl group, a sulfonic acid group and a hexafluoroisopropanol group (—C(CF$_3$)$_2$OH), with the intention of retaining satisfactory developability in alkali developers, or/and other hydrophobic comonomers, such as alkyl acrylate and alkyl methacrylate, for the purpose of improving film properties.

Examples of repeating units derived from those comonomers are illustrated below, but these examples should not be construed as limiting the scope of the invention.

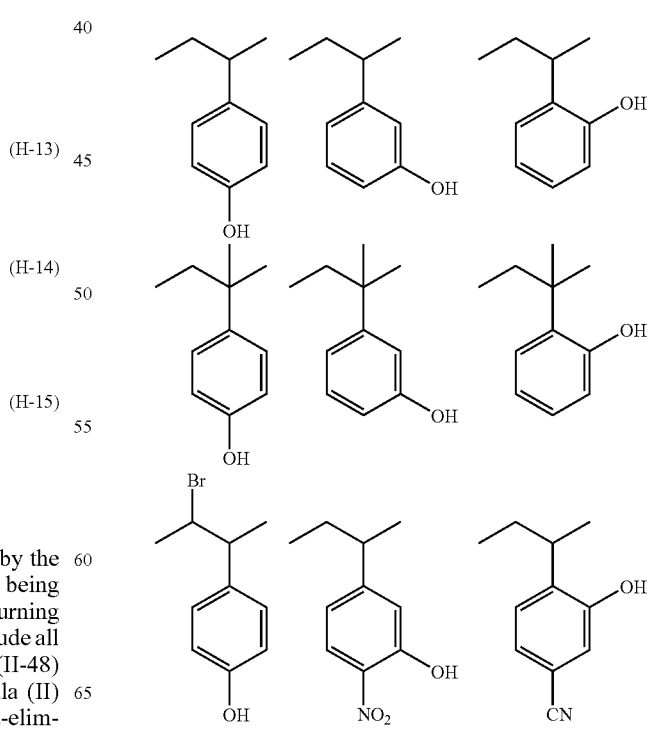

Examples of repeating units which are represented by the formula (II) what's more, which have properties of being insoluble or slightly soluble in alkali developers but turning soluble in alkali developers under action of an acid include all of the binary combinations of the examples (II-1) to (II-48) concerning repeating units represented by the formula (II) with the examples (H-1) to (H-15) concerning acid-eliminable groups represented by X.

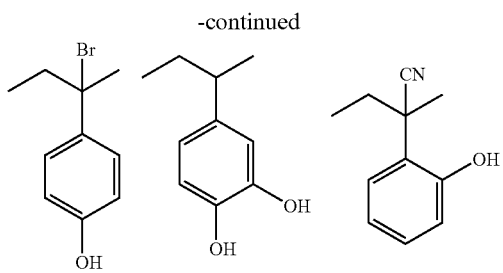
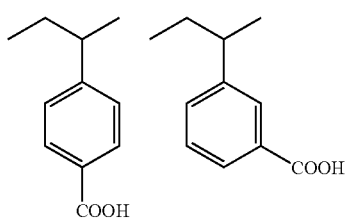
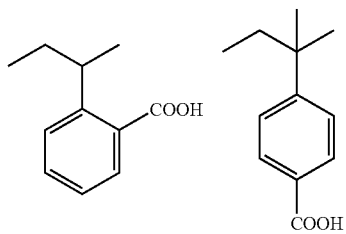
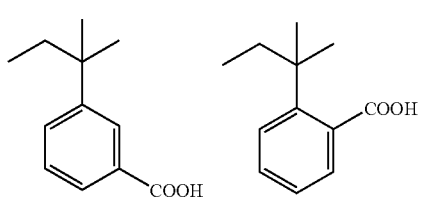
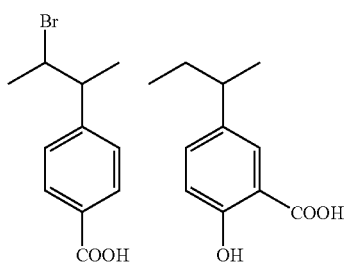
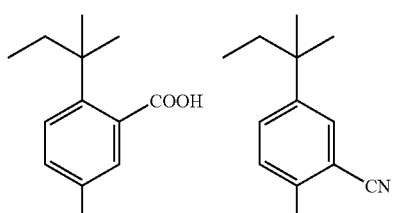
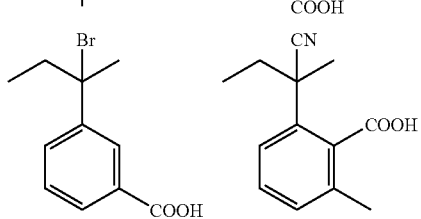

For the purpose of adjusting the hydrophile-hydrophobe balance in Resin (A), methacrylate or acrylate having a hydrophilic group, such as an alkyleneoxy or lactone group, may be introduced into Resin (A) by copolymerization.

In addition to them, other comonomers such as styrene (which may be substituted with an alkyl group, a halogen atom, an alkylthio group, a sulfonyl group or an ester group), vinylnaphthalene (which may be substituted with an alkyl group, a halogen atom, an alkylthio group, a sulfonyl group or an ester group), vinylanthracene (which may be substituted with an alkyl group, a halogen atom, an alkylthio group, a sulfonyl group or an ester group), acrylamide, methacrylamide, an allyl compound, vinyl ether and vinyl ester, may be introduced into Resin (A) by copolymerization.

The content of repeating units represented by the formula (I) in Resin (A) is preferably from 2 to 75 mole %, far preferably from 3 to 50 mole %, particularly preferably from 5 to 35 mole %, of the total repeating units constituting the resin.

The content of repeating units represented by the formula (II) in Resin (A) is preferably from 1 to 95 mole %, far preferably from 2 to 50 mole %, particularly preferably from 3 to 35 mole %, of the total repeating units constituting the resin.

The content of repeating units having alkali-soluble groups, such as hydroxyl, carboxyl and sulfonic acid groups, in Resin (A) is preferably from 1 to 99 mole %, far preferably from 3 to 95 mole %, particularly preferably from 5 to 90 mole %, of the total repeating units constituting the resin.

The weight-average molecular weight (Mw) of Resin (A) is preferably from 1,000 to 30,000, far preferably from 3,000 to 20,000. The dispersion degree (Mw/Mn) of Resin (A) is preferably from 1.0 to 2.0, far preferably from 1.0 to 1.8, particularly preferably from 1.0 to 1.5. The weight-average molecular weight is defined as the value measured by gel permeation chromatography and calculated in terms of polystyrene.

Resin (A) whose dispersion degree is from 1.3 to 2.0 can be synthesized by radical polymerization using an azo-type polymerization initiator. As to preferable Resin (A) having a dispersion degree of 1.0 to 1.5, synthesis of such resin can be achieved by living radical polymerization.

Resin (A) may be a combination of two or more different resins falling under the category of Resin (A).

The total amount of Resin (A) added is generally from 10 to 96 mass %, preferably from 15 to 96 mass %, particularly preferably from 20 to 95 mass %, referred to the total solids in the resist composition.

The rate of acid-decomposable group content is expressed as B/(B+S) where B is the number of acid-decomposable groups in the resin and S is the number of alkali-soluble groups, which are not protected with acid-eliminable groups, in the resin. Such a content rate is preferably from 0.01 to 0.7, far preferably from 0.05 to 0.50, further preferably from 0.05 to 0.40.

(B) Compound Capable of Generating Acid upon Irradiation with Actinic Ray or Radiation The present resist composition contains a compound capable of generating an acid upon irradiation with an actinic ray or radiation (hereinafter referred to as "acid generator" too).

The compound used as such an acid generator can be selected appropriately from photo-initiators for cationic photopolymerization, photo-initiators for radical photopolymerization, photodecoloring agents for dyes, photodiscoloring agents, compounds known to generate acids upon irradiation with actinic rays or radiation and used in microresist and the like, or a mixture of any two or more of the above-recited ones.

Examples of such an acid generator include diazonium salts, phosphonium salts, sulfonium salts, iodonium salts, imide sulfonate, oxime sulfonate, diazodisulfone, disulfone and o-nitrobenzylsulfonate.

In addition, it is also possible to use polymeric compounds having main or side chains into which those groups or compounds capable of generating acids upon irradiation with actinic rays or radiation are introduced, with examples including the compounds as disclosed, e.g., in U.S. Pat. No. 3,849,137, German Patent No. 3914407, JP-A-63-26653, JP-A-55-164824, JP-A-62-69263, JP-A-63-146038, JP-A-63-163452, JP-A-62-153853 and JP-A-63-146029.

Further, the compounds capable of generating acids upon exposure to light as disclosed in U.S. Pat. No. 3,779,778 and European Patent No. 126,712 can also be used.

The preferred among compounds capable of generating acids upon irradiation with actinic rays or radiation include compounds represented by the following formulae (ZI), (ZII) and (ZIII).

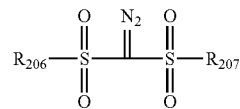

ZI

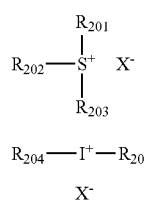

ZII

-continued

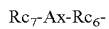

ZIII

In the formula (ZI), $R_{201}$, $R_{202}$ and $R_{203}$ independently represent an organic group.

$X^-$ represents a non-nucleophilic anion, with suitable examples including a sulfonic acid anion, a carboxylic acid anion, a bis(alkylsulfonyl)amide anion, a tris(alkylsulfonyl) methide anion, $BF_4^-$, $PF_6^-$ and $SbF_6^-$. Of these anions, the organic anions containing carbon atoms are preferred over the others.

Such preferred organic anions are organic anions represented by the following formulae (AN1) to (AN4),

In the formulae (AN1) and (AN2), $Rc_1$ represents an organic group.

Examples of the organic group of $Rc_1$ include groups containing 1 to 30 carbon atoms, preferably alkyl groups and aryl groups, which each may have a substituent, and groups formed by combining two or more of those groups via linkage, such as a single bond, —O—, —$CO_2$—, —S—, —$SO_3$— or —$SO_2N(Rd_1)$—.

$Rd_1$ represents a hydrogen atom or an alkyl group, or may form a ring structure by combining with the alkyl or aryl group to which the linkage is attached.

The organic group far preferred as $Rc_1$ is an alkyl group which is substituted by a fluorine atom or a fluoroalkyl group at the 1-position, or a phenyl group which is substituted by a fluorine atom or a fluoroalkyl group. By having a fluorine atom or a fluoroalkyl group, the acid generated by light exposure can have an increased acidity, and the sensitivity can be enhanced. When the organic group of $Rc_1$ contains 5 or more carbon atoms, it is preferable that not all hydrogen atoms attached to at least one carbon atom are substituted by fluorine atoms but hydrogen atoms remain in part, and it is preferable by far that the number of hydrogen atoms is greater than the number of fluorine atoms. By being free of a perfluoroalkyl group containing 5 or more carbon atoms, the toxicity of organic anions to ecosystems can be diminished.

The most favorable form of $Rc_1$ is a group represented by the following formula.

$Rc_7\text{-}Ax\text{-}Rc_6\text{-}$

In the above formula, $Rc_6$ represents a perfluoroalkylene group containing at most 4 carbon atoms, preferably 2 to 4 carbon atoms, far preferably 2 or 3 carbon atoms, or a phenylene group substituted by 1 to 4 fluorine atoms or 1 to 3 fluoroalkyl groups.

Ax represents a linkage group (preferably a single bond, —O—, —CO$_2$—, —S—, —SO$_3$— or —SO$_2$N(Rd$_1$)—). Rd$_1$ represents a hydrogen atom or an alkyl group, or it may combine with Rc$_7$ to form a ring.

Rc$_7$ represents a hydrogen atom, a fluorine atom, or a straight-chain or branched alkyl, monocyclic or polycyclic cycloalkyl or aryl group which may have one or more substituents; however, it is preferable that no fluorine atom is included in the substituents the alkyl, cycloalkyl and aryl groups may have.

In the formulae (AN3) and (AN4), Rc$_3$, Rc$_4$ and Rc$_5$ independently represent an organic group.

Examples of the organic group suitable as Rc$_3$, Rc$_4$ and Rc$_5$ in the formulae (AN3) and (AN4) each include the same ones as the examples of the organic group suitable as Rc$_1$ include.

Rc$_3$ and Rc$_4$ may combine with each other to form a ring.

Examples of the group formed by combining Rc$_3$ with Rc$_4$ include alkylene groups and arylene groups, preferably perfluoroalkylene groups containing 2 to 4 carbon atoms.

It is advantageous to form a ring by combining Rc$_3$ with Rc$_4$, because the ring formation can increase acidity of the acid generated by light exposure and enhance the sensitivity.

The number of carbon atoms in the organic group of R$_{201}$, R$_{202}$ and R$_{203}$ each is generally from 1 to 30, preferably from 1 to 20.

Any two of R$_{201}$ to R$_{203}$ may combine with each other to form a ring, and the ring formed may contain an oxygen atom, a sulfur atom, an ester link, an amide link or a carbonyl group.

Examples of a group formed by combining any two or R$_{201}$ to R$_{203}$ include alkylene groups (such as a butylene group and a pentylene group).

Examples of organic groups as R$_{201}$, R$_{202}$ and R$_{203}$ include the corresponding groups in Compounds (ZI-1), (ZI-2) and (ZI-3) described below.

Additionally, the acid generator may be a compound having two or more structures represented by the formula (ZI). For example, the acid generator may be a compound having a structure that at least one of R$_{201}$ to R$_{203}$ in one compound represented by the formula (ZI) is combined with at least one of R$_{201}$ to R$_{203}$ in another compound represented by the formula (ZI).

Examples of a further preferred Compound (ZI) include Compounds (ZI-1), (ZI-2) and (ZI-3) illustrated below.

The Compound (ZI-1) is an arylsulfonium compound that at least one of R$_{201}$ to R$_{203}$ in the formula (ZI) is an aryl group, namely a compound whose cation is an arylsulfonium.

In the arylsulfonium compound, all of R$_{201}$ to R$_{203}$ may be aryl groups, or one or two of R$_{201}$ to R$_{203}$ may be aryl groups and the remainder may be an alkyl group or a cycloalkyl group.

Examples of the arylsulfonium compound include triarylsulfonium compounds, diarylalkylsulfonium compounds, aryldialkylsulfonium compounds, diarylcycloalkylsulfonium compound and aryldicycloalkylsulfonium compounds.

Suitable examples of an aryl group in the arylsulfonium compound include aryl groups, such as a phenyl group and a naphthyl group, and heteroaryl groups, such as an indole residue and a pyrrole residue. Of these groups, a phenyl group and an indole residue are preferred over the others. When the arylsulfonium compound has at least two aryl groups, these aryl groups may be the same or different.

The alkyl group the arylsulfonium compound has on an as needed basis is preferably a straight-chain or branched alkyl group containing 1 to 15 carbon atoms, such as a methyl group, an ethyl group, a propyl group, an n-butyl group, a sec-butyl group or a t-butyl group.

The cycloalkyl group the arylsulfonium compound has on an as needed basis is preferably a cycloalkyl group containing 3 to 15 carbon atoms, such as a cyclopropyl, a cyclobutyl group or a cyclohexyl group.

The aryl group, the alkyl group and the cycloalkyl group that R$_{201}$ to R$_{203}$ each can represent may have as their respective substituents alkyl groups (containing, e.g., 1 to 15 carbon atoms), cycloalkyl groups (containing, e.g., 3 to 15 carbon atoms), aryl groups (containing, e.g., 6 to 14 carbon atoms), alkoxy groups (containing, e.g., 1 to 15 carbon atoms), halogen atoms, a hydroxyl group or a phenylthio group. Suitable examples of such substituents include straight-chain or branched alkyl groups containing 1 to 12 carbon atoms, cycloalkyl groups containing 3 to 12 carbon atoms and straight-chain or branched alkoxy groups containing 1 to 12 carbon atoms. Of these groups, alkyl groups containing 1 to 4 carbon atoms and alkoxy group containing 1 to 4 carbon atoms are especially preferred. Only one among three groups R$_{201}$ to R$_{203}$ may have a substituent, or all of them may have substituents. When R$_{201}$ to R$_{203}$ are aryl groups, it is preferable that each aryl group has a substituent at the p-position.

In the next place, Compound (ZI-2) is described.

The Compound (ZI-2) is a compound that R$_{201}$ to R$_{203}$ in the formula (ZI) independently represent an organic group containing no aromatic ring. The term "aromatic ring" used herein is intended to include hetero atom-containing aromatic rings too.

The number of carbon atoms in an aromatic ring-free organic group as each of R$_{201}$ to R$_{203}$ is generally from 1 to 30, preferably from 1 to 20.

R$_{201}$, R$_{202}$ and R$_{203}$ are independent of one another, and each of them is preferably an alkyl group, a cycloalkyl group, an allyl group or a vinyl group, far preferably a straight-chain, branched or cyclic 2-oxoalkyl group or an alkoxycarbonylmethyl group, particularly preferably a straight-chain or branched 2-oxoalkyl group.

The alkyl group as each of R$_{201}$ to R$_{203}$ may have a straight-chain or branched form, with suitable examples including straight-chain or branched alkyl groups containing 1 to 10 carbon atoms (such as a methyl group, an ethyl group, a propyl group, a butyl group and a pentyl group). The alkyl group as each of R$_{20}$, to R$_{203}$ is preferably a straight-chain or branched 2-oxoalkyl group or an alkoxycarbonylmethyl group.

Suitable examples of the cycloalkyl group as each of R$_{201}$ to R$_{203}$ include cycloalkyl groups containing 3 to 10 carbon atoms (such as a cyclopentyl group, a cyclohexyl group or a norbornyl group). Of the cycloalkyl groups as R$_{201}$ to R$_{203}$, cyclic 2-oxoalkyl groups are preferred over the others.

The 2-oxoalkyl groups as R$_{201}$ to R$_{203}$ may be straight-chain, branched or cyclic in structure, and suitable examples thereof include the alkyl and cycloalkyl groups as recited above which each have >C=O at the 2-position.

Suitable examples of an alkoxy moiety in the alkoxycarbonylmethyl group as R$_{201}$ to R$_{203}$ each include alkoxy groups containing 1 to 5 carbon atoms (such as a methoxy group, an ethoxy group, a propoxy group, a butoxy group and a pentoxy group).

R$_{201}$ to R$_{203}$ each may further be substituted by a halogen atom, an alkoxy group (containing, e.g., 1 to 5 carbon atoms), a hydroxyl group, a cyano group or a nitro group.

The Compound (ZI-3) is a compound represented by the following formula (ZI-3), namely a compound having a phenacylsulfonium salt structure.

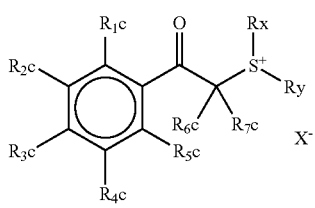

(ZI-3)

In the formula (ZI-3), $R_1c$ to $R_5c$ independently represent a hydrogen atom, an alkyl group, a cycloalkyl group, an alkoxy group or a halogen atom.

$R_6c$ and $R_7c$ independently represent a hydrogen atom, an alkyl group or a cycloalkyl group.

Rx and Ry independently represent an alkyl group, a cycloalkyl group, an allyl group or a vinyl group.

Any two or more of $R_1c$ to $R_7c$ may combine with one another to form a ring structure, and Rx and Ry may also combine with each other to form a ring structure. The ring structure formed may contain an oxygen atom, a sulfur atom, an ester linkage, or an amide linkage. Examples of a group formed by combining any two or more of $R_1c$ to $R_7c$ or by combining Rx and Ry include a butylene group and a pentylene group.

$X^-$ represents a non-nucleophilic anion, and it is the same as $X^-$ in the formula (ZI).

The alkyl group as $R_1c$ to $R_7c$ each may be a straight-chain or branched alkyl group, with examples including straight-chain and branched alkyl groups containing 1 to 20, preferably 1 to 12, carbon atoms (such as a methyl group, an ethyl groups straight-chain and branched propyl groups, straight-chain and branched butyl groups, and straight-chain and branched pentyl groups).

The cycloalkyl group as $R_1c$ to $R_7c$ each is preferably a cycloalkyl group containing 3 to 8 carbon atoms (such as a cyclopentyl group or a cyclohexyl group).

The alkoxy group as $R_1c$ to $R_5c$ may be a straight-chain, branched or cyclic alkoxy group, with examples including alkoxy groups containing 1 to 10 carbon atoms, preferably straight-chain and branched alkoxy groups containing 1 to 5 carbon atoms (such as a methoxy group, an ethoxy group, straight-chain and branched propoxy groups, straight-chain and branched butoxy groups, and straight-chain and branched pentoxy groups), and cyclic alkoxy groups containing 3 to 8 carbon atoms (such as a cyclopentyloxy group and a cyclohexyloxy group).

It is preferable that any of $R_1c$ to $R_5c$ is a straight-chain or branched alkyl groups a cycloalkyl group or a straight-chain, branched or cyclic alkoxy group, and it is preferable by far that the total number of carbon atoms in $R_1c$ to $R_5c$ is from 2 to 15. By satisfying such conditions, solvent solubility is enhanced and formation of particles during storage can be retarded.

Examples of the alkyl group as Rx and Ry each include the same ones as the examples of the alkyl group as $R_1c$ to $R_5c$ each include. The alkyl group as Rx and Ry each is preferably a straight-chain or branched 2-oxoalkyl group or an alkoxy-carbonylmethyl group.

Examples of the straight-chain, branched or cyclic 2-oxoalkyl group include groups that the alkyl or cycloalkyl groups recited as $R_1c$ to $R_7c$ have $>C=O$ at their respective 2-positions.

Examples of an alkoxy moiety in the alkoxycarbonylmethyl group include the same ones as the examples of an alkoxy group as each of $R_1c$ to $R_5c$ include.

Rx and Ry each is preferably an alkyl group containing at least 4 carbon atoms, far preferably an alkyl group containing at least 6 carbon atoms, further preferably an alkyl group containing at least 8 carbon atoms.

In the formulae (ZII) and (ZIII), $R_{204}$ to $R_{207}$ independently represent an unsubstituted or substituted aryl group, an unsubstituted or substituted alkyl group, or an unsubstituted or substituted cycloalkyl group.

As to the aryl group of $R_{204}$ to $R_{207}$ each, a phenyl group and a naphthyl group are preferred, and a phenyl group is far preferred.

The alkyl group of $R_{204}$ to $R_{207}$ each may be a straight-chain or branched alkyl group, preferably a straight-chain or branched alkyl group containing 1 to 10 carbon atoms (such as a methyl group, an ethyl group, a propyl group, a butyl group or a pentyl group).

The cycloalkyl group of $R_{204}$ to $R_{207}$ each is preferably a cycloalkyl group containing 3 to 10 carbon atoms (such as a cyclopentyl group, a cyclohexyl group or a norbornyl group).

Examples of a substituent that $R_{204}$ to $R_{207}$ each may have include alkyl groups (containing, e.g., 1 to 15 carbon atoms), cycloalkyl groups (containing, e.g., 3 to 15 carbon atoms), aryl groups (containing, e.g., 6 to 15 carbon atoms), alkoxy groups (containing, e.g., 1 to 15 carbon atoms), halogen atoms, a hydroxyl group and a phenylthio group.

$X^-$ represents a non-nucleophilic anion, and examples thereof include the same ones as the examples of $X^-$ in the formula (ZI) include.

Examples of the preferred among the compounds capable of generating acids upon irradiation with actinic rays or radiation can further include compounds represented by the following formulae (ZIV), (ZV) and (ZVI).

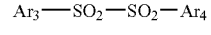

ZIV

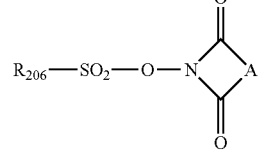

ZV

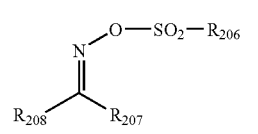

ZVI

In the formulae (ZIV) to (ZVI), $Ar_3$ and $Ar_4$ independently represent a substituted or unsubstituted aryl group.

$R_{206}$ represents a substituted or unsubstituted alkyl group, a substituted or unsubstituted cycloalkyl group, or a substituted or unsubstituted aryl group.

$R_{207}$ and $R_{208}$ each represent a substituted or unsubstituted alkyl group, a substituted or unsubstituted cycloalkyl group, a substituted or unsubstituted aryl group, or an electron-attracting group. $R_{207}$ is preferably a substituted or unsubstituted aryl group, and $R_{208}$ is preferably an electron-attracting group, far preferably a cyano group or a fluoroalkyl group.

A represents a substituted or unsubstituted alkylene group, a substituted or unsubstituted alkenylene group, or a substituted or unsubstituted arylene group.

Of the compounds capable of generating acids upon irradiation with actinic rays or radiation, the compounds represented by the formulae (ZI) to (ZIII) are preferred over the others, the compounds represented by (ZI) and (ZII) are preferable by far, and the Compounds (ZI-1) to (ZI-3) are especially preferred.

Furthermore, the compounds capable of generating acids represented by the following formulae (AC1) to (AC3) upon irradiation with actinic rays or radiation are favorable.

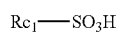

(AC1)

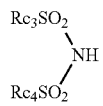

(AC2)

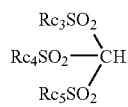

(AC3)

In other words, the Component (B) preferred by far is a compound that $X^-$ in the formula (ZI) is an anion chosen from the organic anions represented by the formula (AN1), (AN3) or (AN4), and the compound that the X is an anion chosen from those of formula (AN3) or (AN4) is especially preferable.

Examples of an especially preferable compound among the compounds capable of decomposing and generating acids upon irradiation with actinic rays or radiation are illustrated below.

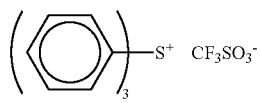

(z1)

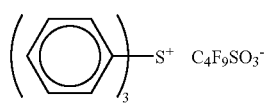

(z2)

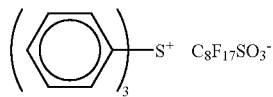

(z3)

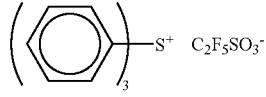

(z4)

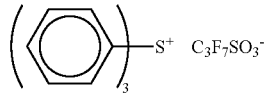

(z5)

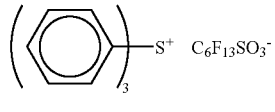

(z6)

-continued

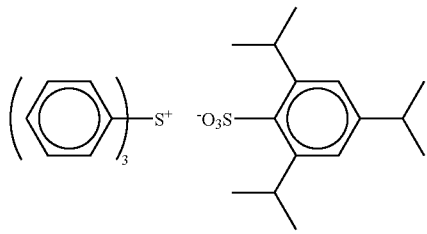

(z7)

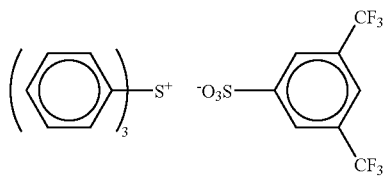

(z8)

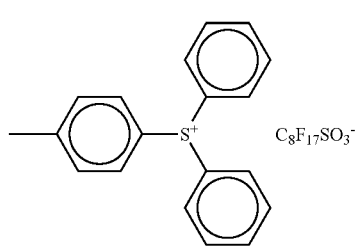

(z9)

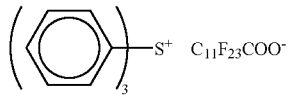

(z10)

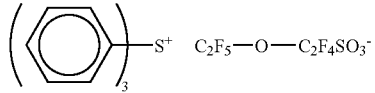

(z11)

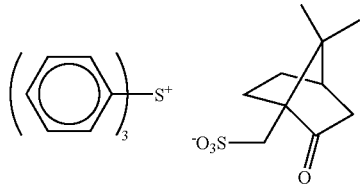

(z12)

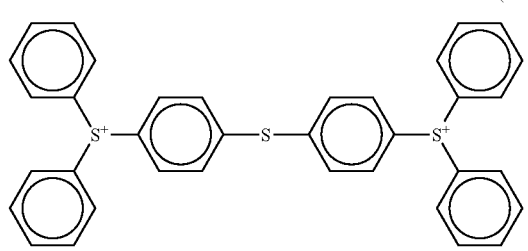

(z13)

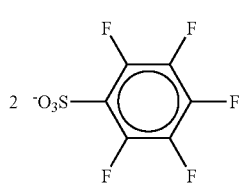

-continued
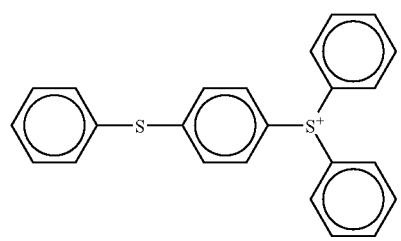 (z14)
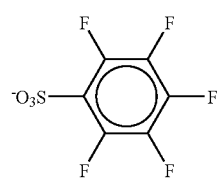
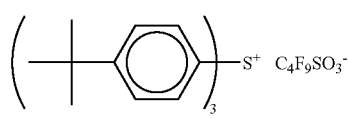 (z15)
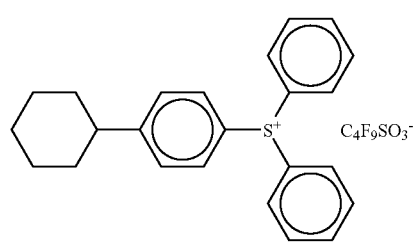 (z16)
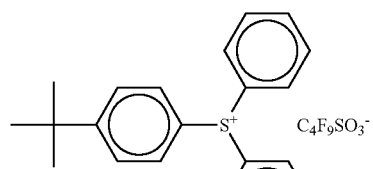 (z17)
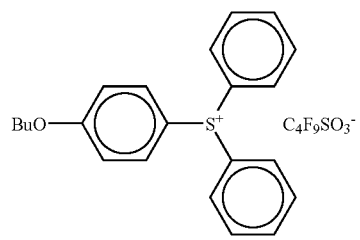 (z18)
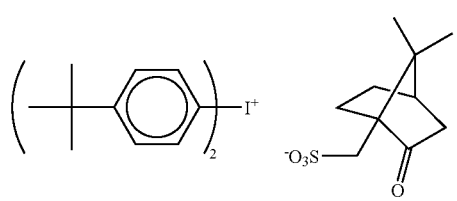 (z19)
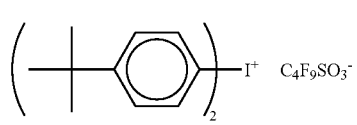 (z20)
-continued
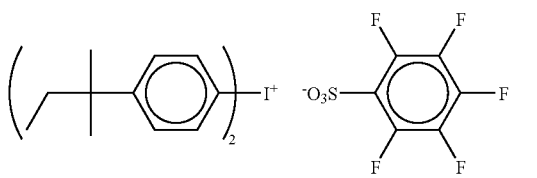 (z21)
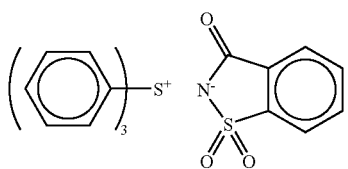 (z22)
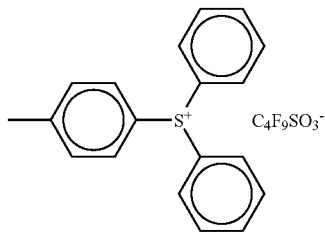 (z23)
 (z24)
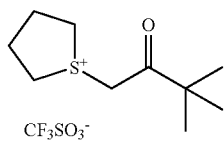 (z25)
(z26)
 (z27)
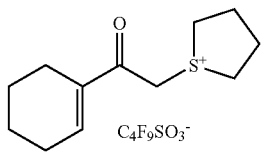 (z28)
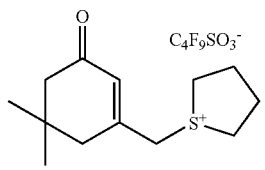 (z29)

-continued
(z30) 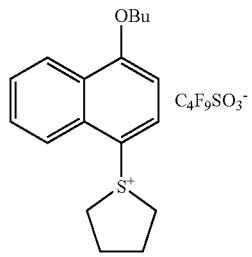
(z31) 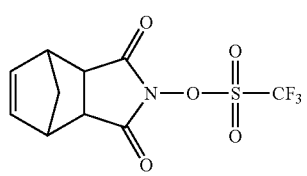
(z32) 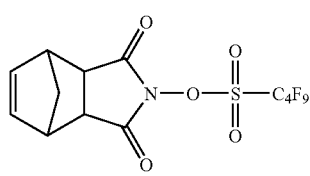
(z33) 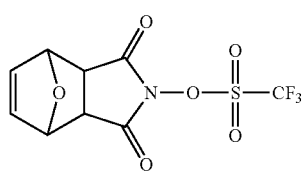
(z34) 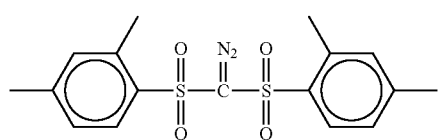
(z35) 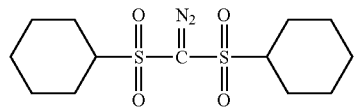
(z36) 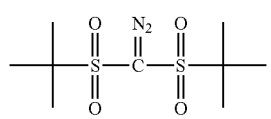
(z37) 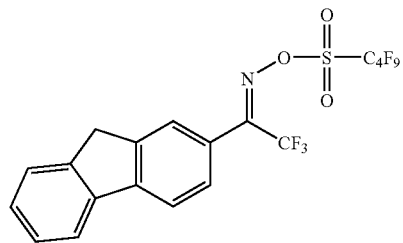
-continued
(z38) 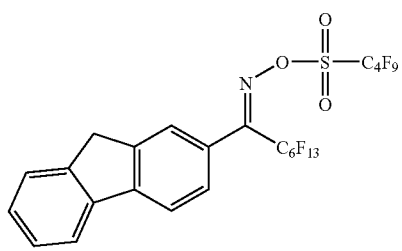
(z39) 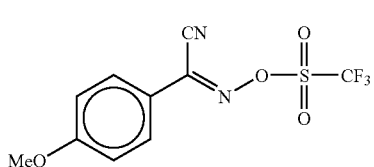
(z40) 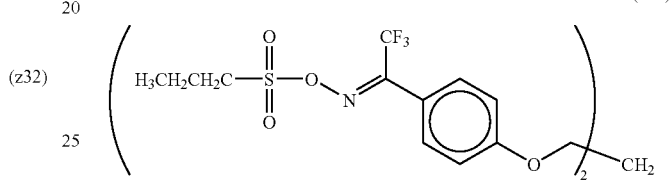
(z41) 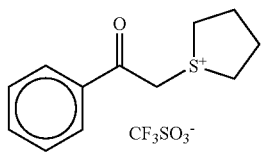
(z42) 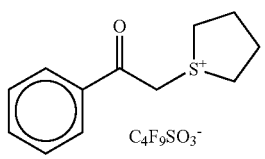
(z43) 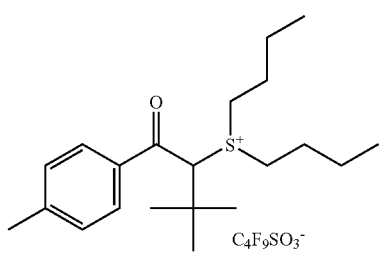
(z44) 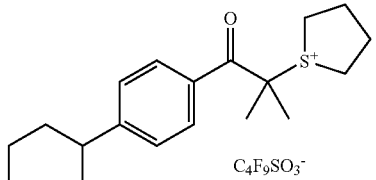
(z45) 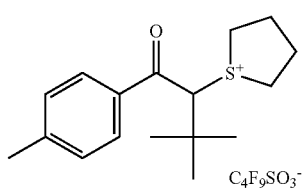

-continued
(z46) 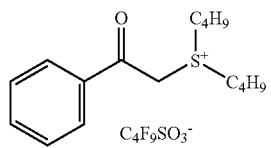
(z47) 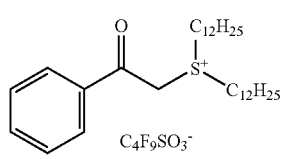
(z48) 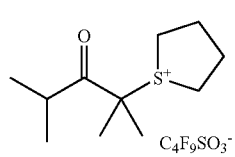
(z49) 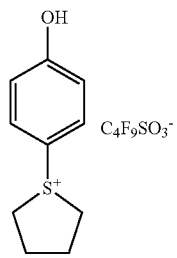
(z50) 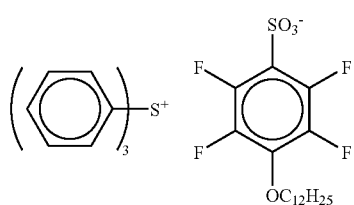
(z51) 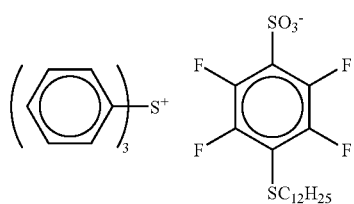
(z52) 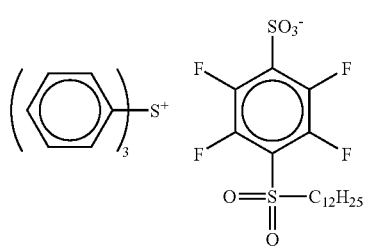
(z53) 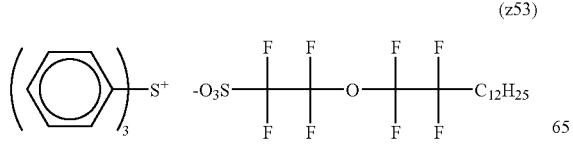
-continued
(z54) 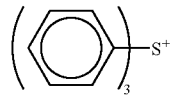
(z55) 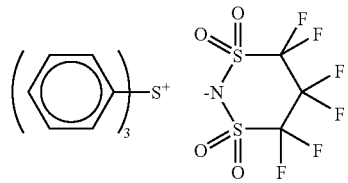
(z56) 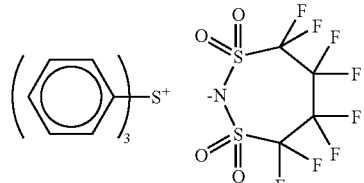
(z57) 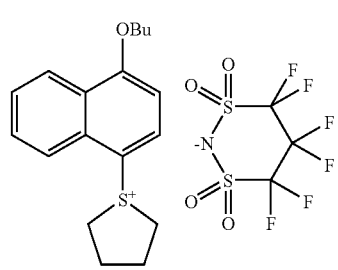
(z58) 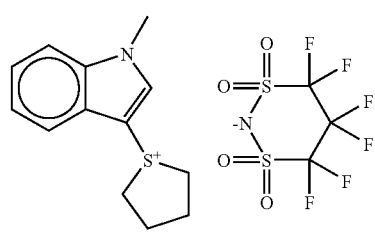
(z59) 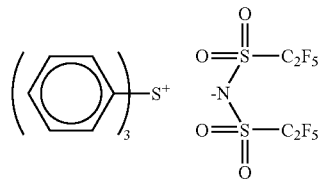
(z60) 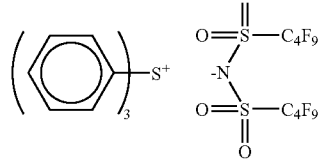

(z61) 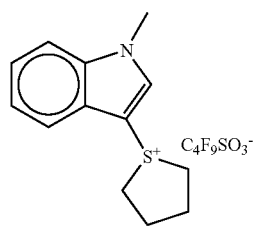
(z62) 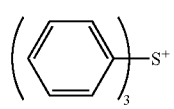
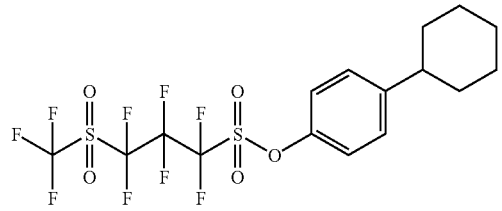
(z63) 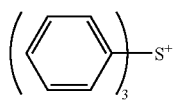
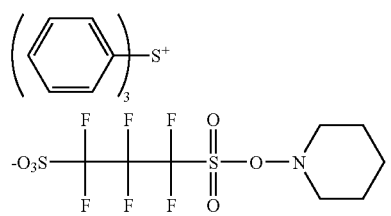
(z64) 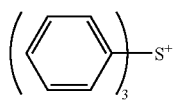
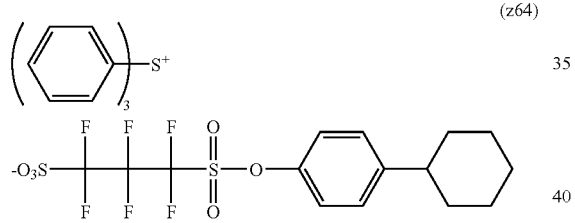
(z65) 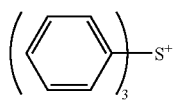 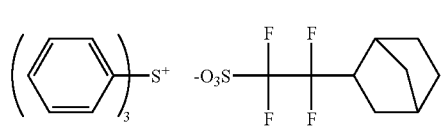
(z66) 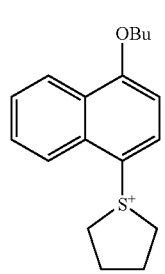
(z67) 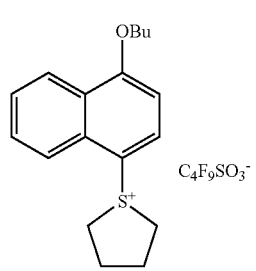
(z68) 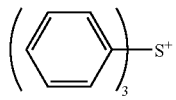
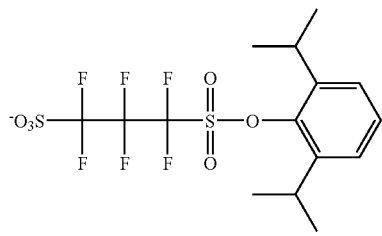
(z69) 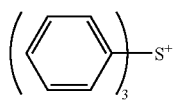
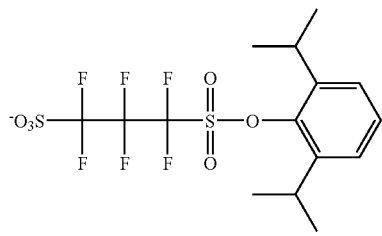
(z70) 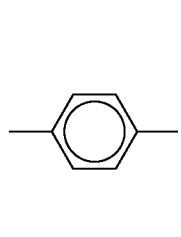
(z71) 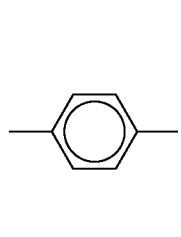
(z72) 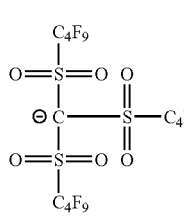
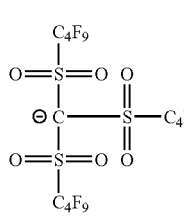

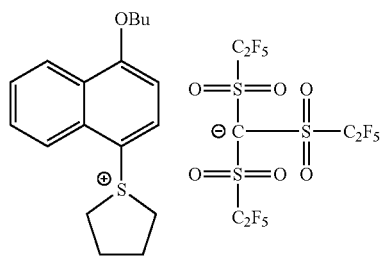 (z73)
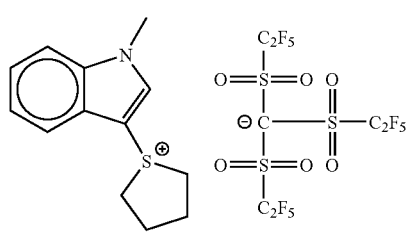 (z74)
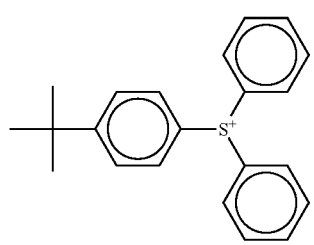 (z75)
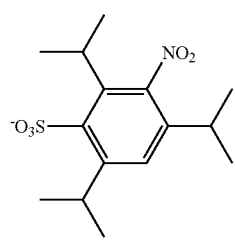
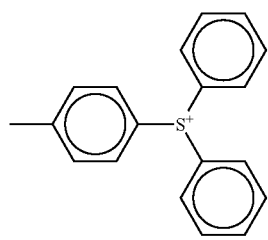 (z76)
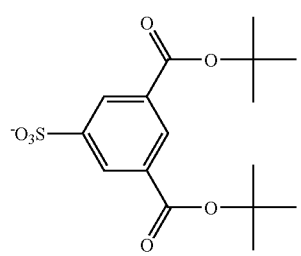
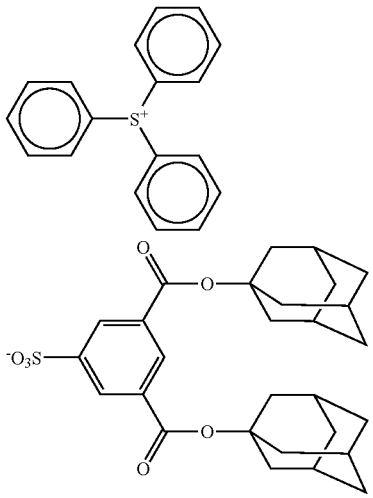 (z77)
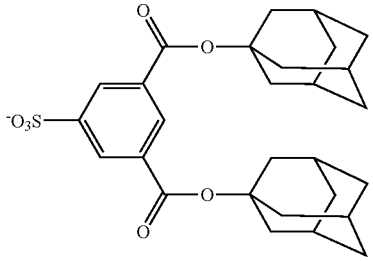 (z78)
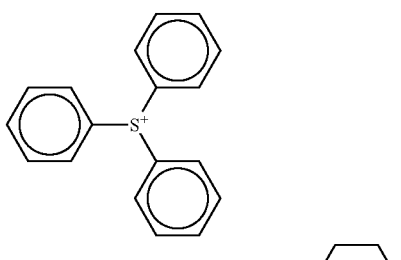
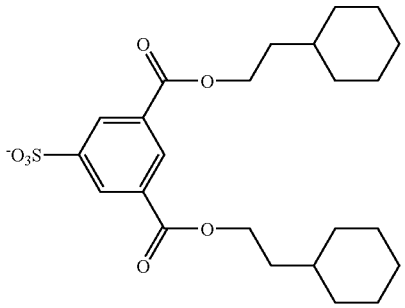 (z79)
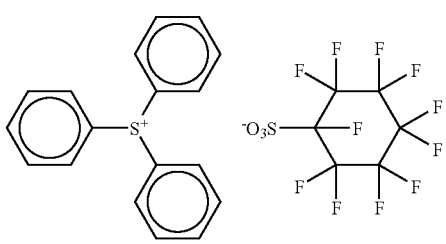 (z80)
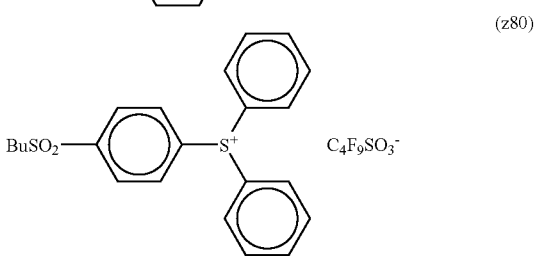
The acid generators can be used alone or as combinations of two or more thereof. When two or more acid generators are used in combination, it is advantageous to use a combination of compounds capable of generating two kinds of organic acids which differ by two or more in number of all constituent atoms except hydrogen atoms.

The content of acid generators in the resist composition is preferably from 0.1 to 20 mass %, far preferably from 0.5 to 10 mass %, further preferably from 1 to 7 mass %, based on the total solids in the composition.

(C) Basic Compound

For reducing changes in properties with a lapse of time from exposure to heating or controlling diffusion of acids generated by exposure in resist film, it is favorable that a basic compound is incorporated in the present resist composition Examples of a basic compound incorporated for the foregoing purpose include nitrogen-containing basic compounds and onium salt compounds. In point of structures suitable for such nitrogen-containing basic compounds, it is advantageous for the compounds to have partial structures illustrated by the following formulae (A) to (E).

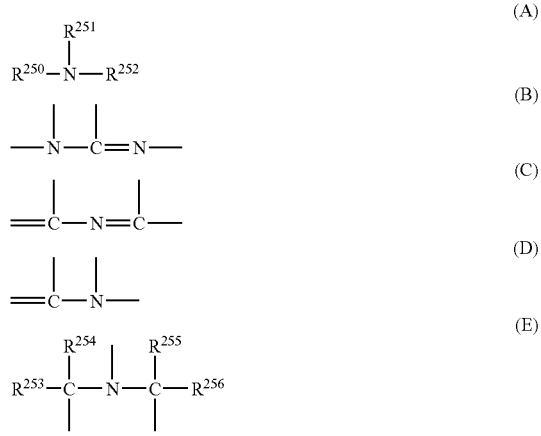

In the formula (A), $R^{250}$, $R^{251}$ and $R^{252}$ independently represent a hydrogen atom, an alkyl group containing 1 to 20 carbon atoms, a cycloalkyl group containing 3 to 20 carbon atoms or an aryl group containing 6 to 20 carbon atoms. Herein, $R^{250}$ and $R^{251}$ may combine with each other to form a ring. Each of these groups and the ring may have a substituent. Suitable examples of alkyl and cycloalkyl groups having substituents include aminoalkyl groups containing 1 to 20 carbon atoms, aminocycloalkyl groups containing 3 to 20 carbon atoms, hydroxyalkyl groups containing 1 to 20 carbon atoms and hydroxycycloalkyl groups containing 3 to 20 carbon atoms.

Additionally, these alkyl chains each may contain an oxygen atom, a sulfur atom or a nitrogen atom.

In the formula (E) $R^{253}$, $R^{254}$, $R^{255}$ and $R^{256}$ independently represent an alkyl group containing 1 to 6 carbon atoms or a cycloalkyl group containing 3 to 6 carbon atoms.

Examples of suitable basic compounds include guanidine, aminopyrrolidine, pyrazole, pyrazoline, piperazine, aminomorpholine, aminoalkylmorpholine and piperidine, and these compounds may have substituents. And examples of more suitable basic compounds include compounds of imidazole structure, compounds of diazabicyclo structure, compounds of onium hydroxide structure, compounds of onium carboxylate structure, compounds of trialkylamine structure, compounds of aniline structure, compounds of pyridine structure, alkylamine derivatives having hydroxyl groups and/or ether linkages, and aniline derivatives having hydroxyl groups and/or ether linkages.

The compounds of imidazole structure can include imidazole, 2,4,5-triphenylimidazole and benzimidazole. The compounds of diazabicyclo structure can include 1,4-diazabicyclo[2.2.2]octane, 1,5-diazabicyclo[4.3.0]nona-5-ene and 1,8-diazabicyclo[5.4.0]undeca-7-en. The compounds of onium hydroxide structure can include triarylsulfonium hydroxides, phenacylsulfonium hydroxides and sulfonium hydroxides having 2-oxoalkyl groups, and more specifically include triphenylsulfonium hydroxide, tris(t-butylphenyl) sulfonium hydroxide, bis(t-butylphenyl)iodonium hydroxide, phenacylthiophenium hydroxide and 2-oxopropylthiophenium hydroxide. The compounds of onium carboxylate structure are compounds that the onium hydroxide structures in the compounds as recited above are replaced with onium carboxylate structures, and examples of such a carboxylate include acetate, adamantane-1-carboxylate and perfluoroalkylcarboxylate. The compounds of trialkylamine structure include tri(n-butyl)amine and tri(n-octyl)amine. The aniline compounds include 2,6-diisopropylaniline and N,N-dimethylaniline. The alkylamine derivatives having hydroxyl groups and/or ether linkages include ethanolamine, diethanolamine, triethanolamine and tris(methoxyethoxyethyl)amine. The aniline derivatives having hydroxyl groups and/or ether linkages include N,N-bis(hydroxyethyl)aniline.

In addition, nitrogen-containing basic compounds of tetraalkylammonium salt type can also be used. Of these compounds, tetra(1-8C alkyl)ammonium hydroxides (such as tetramethylammonium hydroxide, tetraethylammonium hydroxide and tetra(n-butyl)ammonium hydroxide) are especially preferred. These nitrogen-containing basic compounds can be used alone or as combinations of two or more thereof.

The basic compounds as mentioned above are used alone or as combinations of two or more thereof. The basic compounds are used in an amount of generally 0.001 to 10 mass %, preferably 0.01 to 5 mass %, based on the total solids in the resist composition. The addition amount of 0.001 mass % or above is suitable from the viewpoint of producing an adequate addition effect, and that of 10 mass % or below is suitable in point of sensitivity and ability of unexposed portions to be developed.

(D) Surfactant

It is preferable that the present resist composition further contains a surfactant containing at least one fluorine atom and/or at least one silicon atom (namely either a surfactant containing at least one fluorine atom, or a surfactant containing at least one silicon atom, or a surfactant containing both fluorine and silicon atoms), or a combination of two or more of these surfactants.

Incorporation of a surfactant containing at least one fluorine atom and/or at least one silicon atom into the present resist composition allows the composition to provide resist patterns having strong adhesion and reduced development defects while ensuring both satisfactory sensitivity and resolution at the time of using an exposure light source of 250 nm or below, notably 220 nm or below.

Examples of a surfactant containing at least one fluorine atom and/or at least one silicon atom include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, SP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercially available surfactants include fluorine-containing surfactants and silicon-containing surfactants, such as Eftop EF301 and EF303 (manufactured by Shin-Akita Kasei K.K.), Florad FC430 and FC431 (manufactured by Sumitomo 3M, Inc.), Megafac F171, F173, F176, F189 and R08 (manufactured by Dainippon Ink & Chemicals, Inc.), Surflon S-382, SC101, SC102, SC103, SC104, SC105 and SC106 (manufactured by Asahi Glass Co., Ltd.), and Troysol S-366 (manufactured by Troy Chemical Industries, Inc.). In addition, organosiloxane polymer KP-341 (manufactured by Shin-Etsu Chemical Co., Ltd.) can be used as a silicon-containing surfactant.

Besides including the surfactants as recited above, the surfactants usable in the invention include surfactants using polymers containing fluorinated aliphatic groups derived from fluorinated aliphatic compounds synthesized by a telomerization method (also referred to as a telomer method) or an oligomerization method (also referred to as an oligomer method). These fluorinated aliphatic compounds can be synthesized in accordance with the methods disclosed in JP-A-2002-90991.

The polymer suitable as a polymer containing fluorinated aliphatic groups is a copolymer of a fluorinated aliphatic group-containing monomer and poly(oxyalkylene) acrylate and/or poly(oxyalkylene) methacrylate, wherein the fluorinated aliphatic group-containing units may be distributed randomly or in blocks. Examples of such a poly(oxyalkylene) group include a poly(oxyethylene) group, a poly(oxypropylene) group and a poly(oxybutylene) group. In addition, the poly(oxyalkylene) group may be a unit containing alkylene groups of different chain lengths in its oxyalkylene chain, such as a poly(oxyethylene block/oxypropylene block/oxyethylene block combination) group or a poly(oxyethylene block/oxypropylene block combination) group. Further, the copolymer of a fluorinated aliphatic group-containing monomer and poly(oxyalkylene) acrylate (or methacrylate) may be a binary copolymer, or the copolymer may be a ternary or higher copolymer prepared by copolymerizing at least two different kinds of fluorinated aliphatic group-containing monomers and at least two different kinds of poly(oxyalkylene) acrylates (or methacrylates) all together.

Examples of a commercially available surfactant of the foregoing polymer type include Megafac F178, F-470, F-473, F-475, F-476 and F472 (manufactured by Dainippon Ink & Chemicals, Inc.). Additional examples of a fluorinated aliphatic group-containing polymer include a copolymer of $C_6F_{13}$ group-containing acrylate (or methacrylate) and poly(oxyalkylene) acrylate (or methacrylate), a terpolymer of $C_6F_{13}$ group-containing acrylate (or methacrylate), poly(oxyethylene) acrylate (or methacrylate) and poly(oxypropylene) acrylate (or methacrylate), a copolymer of $C_8F_{17}$ group-containing acrylate (or methacrylate) and poly(oxyalkylene) acrylate (or methacrylate), and a terpolymer of $C_8F_{17}$ group-containing acrylate (or methacrylate), poly(oxyethylene) acrylate (or methacrylate) and poly(oxypropylene) acrylate (or methacrylate).

Other suitable surfactants include those represented by the following formula (Da).

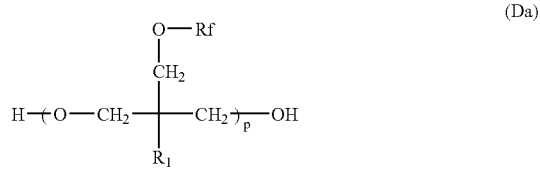

In the formula (Da), Rf represents a fluoroalkyl group, R1 represents a hydrogen atom or an alkyl group, and p represents an integer of 1 to 30.

The fluoroalkyl group of Rf in the formula (Da) is preferably a fluoroalkyl group containing 1 to 10 carbon atoms. As to the fluoroalkyl group, all the hydrogen atoms of alkyl group may be replaced by fluorine atoms, or part of the hydrogen atoms of alkyl group may be replaced by fluorine atoms. In addition, the fluoroalkyl group may have an oxy group at some midpoint in the alkyl chain. Examples of a fluoroalkyl group of Rf include $-CF_3$, $-C_2F_5$, $-C_3F_7$, $-C_4F_9$, $-CH_2CF_3$, $-CH_2C_2F_5$, $-CH_2C_3F_7$, $-CH_2C_4F_9$, $-CH_2C_6F_{13}$, $-C_2H_4CF_3$, $-C_2H_4C_2F_5$, $-C_2H_4C_4H_9$, $-C_2H_4C_6F_{13}$, $-C_2H_4C_8F_{17}$, $-CH_2CH(CH_3)CF_3$, $-CH_2CH(CF_3)_2$, $-CH_2CF(CF_3)_2$, $-CH_2CH(CF_3)_2$, $-CF_2CF(CF_3)OCF_3$, $-CF_2CF(CF_3)OC_3F_7$, $-C_2H_4OCF_2CF(CF_3)OCF_3$, $-C_2H_4OCF_2CF(CF_3)OC_3F_7$ and $-C(CF_3)=C(CF(CF_3)_2)_2$.

The alkyl group of $R_1$ is preferably a straight-chain alkyl group containing 1 to 5 carbon atoms.

Examples of a surfactant represented by the formula (Da) are illustrated below, but these examples should not be construed as limiting the scope of the invention.

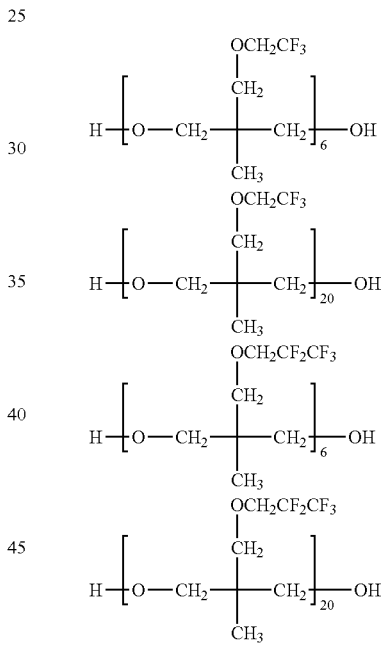

The amount of surfactants added is preferably from 0.0001 to 2 mass %, far preferably 0.001 to 1 mass %, referred to the total ingredients (exclusive of solvent) in the resist composition.

(E) Solvent

The foregoing Components of the present resist composition are dissolved in a solvent in which all of them can dissolve, and coated on a substrate. The suitable concentration of the total solid components in the resist composition is generally from 2 to 30 mass %, preferably from 3 to 25 mass %.

The solvent used suitably herein is a solvent containing at least one kind of solvent selected from a propylene glycol monoalkyl ether carboxylate, a propylene glycol monoalkyl ether, an alkyl lactate, an acetate, an alkyl alkoxypropionate, an open-chain ketone or a cyclic ketone.

The propylene glycol monoalkyl ether carboxylate is preferably propylene glycol monomethyl ether acetate, propylene glycol monomethyl ether propionate, or propylene glycol monoethyl ether acetate.

The propylene glycol monoalkyl ether is preferably propylene glycol monomethyl ether, or propylene glycol monoethyl ether.

The alkyl lactate is preferably ethyl lactate or butyl lactate.

The acetate is preferably butyl acetate.

The alkyl alkoxypropionate is preferably methyl methoxypropionate, or ethyl ethoxypropionate.

The open-chain ketone is preferably methyl amyl ketone.

The cyclic ketone is preferably cyclohexane, γ-butyrolactone, or propylene carbonate.

The foregoing solvents may be used alone or in combination.

The suitable combination of those solvents is a combination of propylene glycol monomethyl ether acetate with one solvent chosen from propylene glycol monomethyl ether, ethyl lactate, butyl acetate, ethyl ethoxypropionate or methyl amyl ketone.

Other Components

The present resist composition can further contain a dye, a photo-base generator and other ingredients as required.

1. Dye

In the invention, a dye can be used.

As the dye used, both oil dye and basic dye are suitable. Examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (trade names, products of Orient Chemical Industries, Ltd.), Crystal Violet (CI42555), Methyl Violet (CI42535), Rhodamine B (CI45170B), Malachite Green (CI42000) and Methylene Blue (CI52015).

2. Photo-Base Generator

Examples of a photo-base generator which can be added to the present resist composition include the compounds disclosed in JP-A Nos. 4-151156, 4-162040, 5-197148, 5-5995, 6-194834, 8-146608 and 10-83079, and European Patent No. 622682. Specifically, 2-nitrobenzyl carbamate, 2,5-dinitrobenzylcyclohexyl carbamate, N-cyclohexyl-4-methylphenylsulfonamide and 1,1-dimethyl-2-phenylethyl N-isopropylcarbamate can be suitably used. These photo-base generators are added for the purpose of improving resist-pattern profiles and so on.

The present resist composition is coated on a substrate and forms a thin film. The thickness of this coating film is preferably from 0.05 to 4.0 μm.

In the invention, it is possible to use a commercially available inorganic or organic antireflective film, if needed. Further, it is also possible to provide an antireflective coating as an upper or lower layer of the resist film.

As the antireflective coating used as a lower layer of the resist film, both types of coatings, a coating of inorganic material, such as titanium, titanium dioxide, titanium nitride, chromium oxide, carbon or amorphous silicon, and a coating of organic material including a light-absorbing agent and a polymeric material, can be utilized. In order to form the inorganic type of coating, installation of vacuum evaporation apparatus, CVD apparatus, sputtering apparatus or the like is required. Examples of an organic antireflective coating include the coating of composition containing a condensate of diphenylamine derivative and formaldehyde-modified melamine resin, an alkali-soluble resin and a light-absorbing agent as disclosed in JP-B-7-69611, the coating of reaction product of a maleic anhydride copolymer and a light-absorbing agent of diamine type as disclosed in U.S. Pat. No. 5,294, 680, the antireflective coating of composition containing a resin binder and a thermally crosslinking agent of methylolmelamine type as disclosed in JP-A-06-118631, the antireflective coating of acryl resin having carboxylic acid groups, epoxy groups and light-absorbing groups in one and the same molecule as disclosed in JP-A-6-118656, the antireflective coating containing methylolmelamine and a light-absorbing agent of benzophenone type as disclosed in JP-A-8-87115, and the antireflective coating of polyvinyl alcohol resin to which a low-molecular light-absorbing agent is added as disclosed in JP-A-8-179509.

Alternatively, commercially available antireflective films, such as DUV30 series and DUV40 series from Brewer Science, Inc., and AR-2, AR-3 and AR-5 from Shipley Far East Ltd., can also be used as the organic antireflective films.

Examples of an organic antireflective coating which is also usable as the upper layer of resist film include commercially available organic antireflective films, such as AQUATAR-II, AQUATAR-III and AQUATAR-VII from AZ Electronic Materials.

In fabrication of high-precision integrated circuit elements and the like, a pattern-forming process includes forming a resist film by coating the present positive-working resist composition on a substrate (e.g., a silicon/silicon dioxide-coated substrate, a glass substrate, an ITO substrate, a quartz/chromium oxide-coated substrate), irradiating the resist film with an actinic ray or radiation, such as KrF excimer laser light, an electron beam or EUV light, and subjecting the irradiated resist film to successive heating, developing, rinsing and drying operations, and thereby resist patterns of good quality can be formed.

The alkali developer usable in the developing operation is an aqueous solution of alkali (generally in concentration of 0.1 to 20 mass %), and examples of the alkali include inorganic alkalis such as sodium hydroxide, potassium hydroxide, sodium carbonate, sodium silicate, sodium metasilicate and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide and choline, and cyclic amines such as pyrrole and piperidine. To the alkali developer, alcohol such as isopropyl alcohol and a nonionic surfactant can be added in respectively appropriate amounts.

Of those alkalis in developers, quaternary ammonium salts are preferable, and tetramethylammonium hydroxide and choline are preferable by far.

The pH of alkali developer is generally from 10 to 15.

EXAMPLES

The invention will now be illustrated in more detail by reference to the following examples, but these examples should not be construed as limiting the scope of the invention.

Synthesis Example 1

Synthesis of Resin (A-1)

In cyclohexanone are dissolved 1-phenylethyl methacrylate, 3-oxoethyl-4-acetoxystyrene and acetoxystyrene in proportions of 30:15:55 by mole, thereby preparing 100 mL of a solution having a solid concentration of 20 mass %. To this solution is added 2 mole % of a polymerization initiator V-601 manufactured by Wako Pure Chemical Industries, Ltd. In an atmosphere of nitrogen, the resulting solution is added dropwise to 10 ml of cyclohexanone heated at 80° C. over 4 hours. After the dropwise addition, the reaction solution is heated and stirred for 4 hours. At the conclusion of the reaction, the reaction solution is cooled to room temperature, and poured into 3 L of hexane to separate a reaction product by crystallization. The thus separated white fine particles are collected by filtration.

This fine powdery polymer is dissolved in a mixture of 100 ml of PEGME and 40 ml of methanol, admixed with 5 ml of hydrochloric acid, stirred for 5 hours at 80° C., and then dripped into distilled water. The thus formed precipitate is washed with distilled water, and dried under a reduced pressure. The thus obtained polymer is dissolved in 100 ml of ethyl acetate, and then precipitated by addition of hexane. The polymer thus precipitated is made a powder by reduced-pressure drying. From the $C^{13}$NMR analysis of this powder, it is determined that the proportions of repeating structural units in the polymer are 31:14:55 by mole. In addition, the polymer obtained has a weight-average molecular weight of 15,000 as measured by GPC and calculated in terms of standard polystyrene.

Synthesis Example 2

Synthesis of Resin (A-18)

The resin (A-1) is dissolved in PGMEA, and thereto pyridinium p-toluenesulfonate and ethyl vinyl ether (EVE) are added in amounts of 1 mole % and 25 mole %, respectively, referred to the resin. In the resulting mixture, reaction is run for 4 hours at room temperature. And the reaction is terminated by addition of 10 mole % of triethylamine. The reaction solution is washed with pure water, and therefrom both PGMEA and water are removed by azeotropic distillation. Thus, a PGMEA solution of Resin (A-18) illustrated below is obtained.

It is determined from $C^{13}$NMR analysis that the proportions of repeating structural units in Resin (A-18) is 31:11:3: 44:11 by mole. In addition, this resin has a weight-average molecular weight of 16,000 as measured by GPC and calculated in terms of standard polystyrene.

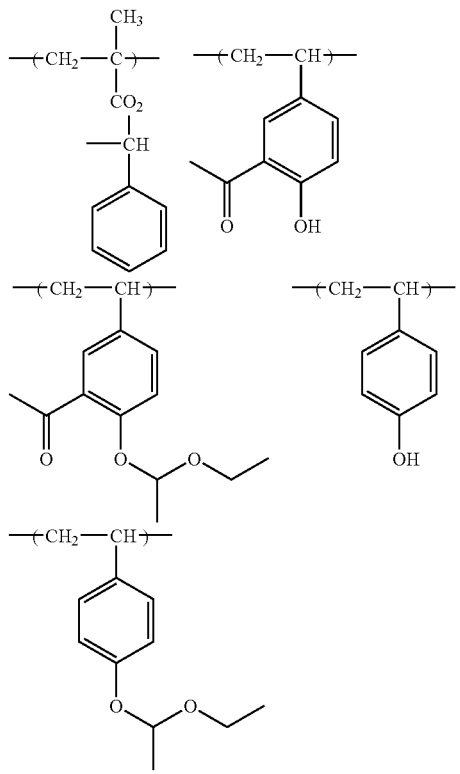

Other resins shown in Table 1 are synthesized in the same procedures as in Synthesis Example 1. All the proportions of repeating structural units as listed in the following table are by mole.

TABLE 1

| Resin | Weight average molecular weight | Repeating Structural Unit (I) | Repeating Structural Unit (II) | Repeating Structural Unit (III) | Proportion of Repeating Structural Unit (I) | (II) | (III) | Dispersion degree |
|---|---|---|---|---|---|---|---|---|
| A-1 | 15,000 | I-44 | II-1 | III-1 | 31 | 14 | 55 | 1.35 |
| A-2 | 18,000 | I-44 | II-41 | III-1 | 21 | 15 | 64 | 1.55 |
| A-3 | 8,000 | I-44 | II-43 | III-2 | 20 | 12 | 68 | 1.50 |
| A-4 | 12,000 | I-28 | II-1 | III-1 | 25 | 12 | 63 | 1.40 |
| A-5 | 8,000 | I-28 | II-41 | III-2 | 26 | 30 | 44 | 1.50 |
| A-6 | 10,000 | I-28 | II-16 | III-1 | 20 | 20 | 60 | 1.45 |
| A-7 | 13,000 | I-1 | II-1 | III-1 | 29 | 14 | 57 | 1.35 |
| A-8 | 15,000 | I-1 | II-41 | III-1 | 30 | 17 | 53 | 1.30 |
| A-9 | 6,000 | I-1 | II-2 | III-2 | 28 | 22 | 50 | 1.25 |
| A-10 | 10,000 | I-3 | II-18 | III-1 | 32 | 15 | 53 | 1.40 |
| A-11 | 12,000 | I-19 | II-26 | III-1 | 20 | 28 | 52 | 1.60 |
| A-12 | 9,000 | I-31 | II-2 | III-1 | 18 | 8 | 74 | 1.35 |
| A-13 | 13,000 | I-47 | II-4 | III-2 | 23 | 10 | 67 | 1.65 |
| A-14 | 10,000 | I-51 | II-45 | III-1 | 28 | 15 | 57 | 1.45 |
| A-15 | 14,000 | I-53 | II-1 | III-1 | 19 | 15 | 66 | 1.40 |
| A-16 | 11,500 | I-56 | II-16 | III-1 | 20 | 14 | 66 | 1.25 |
| A-17 | 13,000 | I-56 | II-2 | III-1 | 20 | 20 | 60 | 1.40 |
| A-18 | 16,000 | I-44 | II-1/EVE | III-1/EVE | 31 | 11/3 | 44/11 | 1.35 |
| A-19 | 13,000 | I-1 | — | III-1 | 29 | 0 | 71 | 1.35 |
| A-20 | 15,000 | I-28 | — | III-1 | 30 | 0 | 70 | 1.30 |
| A-21 | 12,000 | I-2 | Styrene | III-1 | 10 | 30 | 60 | 1.50 |

The structures of the units (III-1) and (III-2) in Table 1 are illustrated below.

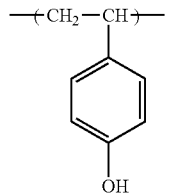
(III-1)

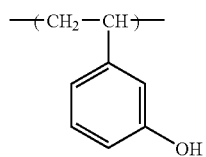
(III-2)

The structure of Resin (A-21) in Table 1 is illustrated below.

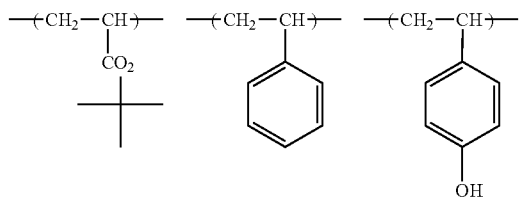

Examples 1 to 27 and Comparative Examples 1 to 3

(1) Preparation and Coating of Positive-Working Resist

In combination as shown in Table 2, various ingredients are dissolved in the solvent as also shown in Table 2. Each of the solutions thus prepared is subjected to microfiltration with a membrane filter having a pore diameter of 0.1 µm. Thus, resist solutions are obtained.

Hexamethyldisilazane treatment is given to an 8-inch silicon wafer, and on the thus treated wafer each of the resist solutions is coated by means of a spin coater ACT8 made by Tokyo Electron Limited and further baked at 120° C. for 60 seconds, thereby forming film having an average thickness of 420 nm.

TABLE 2

| | Resin (0.966 g) | Acid Generator (0.03 g) | | proportion | Organic Base Compound (0.003 g) | Surfactant (0.001 g) | Solvent (14 g) | | proportion | Dye (0.03 g) |
|---|---|---|---|---|---|---|---|---|---|---|
| Example 1 | A-1 | Z1 | — | 100 | C-1 | D-2 | E-1 | E-2 | 80/20 | — |
| Example 2 | A-2 | Z55 | — | 100 | C-1 | D-2 | E-1 | E-2 | 80/20 | — |
| Example 3 | A-3 | Z4 | — | 100 | C-1 | D-2 | E-1 | E-2 | 80/20 | — |
| Example 4 | A-4 | Z2 | Z35 | 50/50 | C-1 | D-2 | E-1 | E-2 | 80/20 | — |
| Example 5 | A-5 | Z22 | — | 100 | C-1 | D-2 | E-1 | E-2 | 80/20 | — |
| Example 6 | A-6 | Z1 | Z40 | 70/30 | C-2 | D-2 | E-1 | E-2 | 80/20 | — |
| Example 7 | A-7 | Z37 | — | 100 | C-1 | D-2 | E-1 | E-2 | 80/20 | — |
| Example 8 | A-8 | Z2 | — | 100 | C-1 | D-2 | E-1 | E-2 | 80/20 | — |
| Example 9 | A-9 | Z4 | — | 100 | C-1 | D-2 | E-1 | E-2 | 80/20 | — |
| Example 10 | A-10 | Z32 | — | 100 | C-1 | D-2 | E-1 | E-2 | 80/20 | — |
| Example 11 | A-11 | Z1 | — | 100 | C-1 | D-2 | E-1 | E-2 | 80/20 | — |
| Example 12 | A-12 | Z60 | — | 100 | C-1 | D-2 | E-1 | E-2 | 80/20 | — |
| Example 13 | A-13 | Z4 | Z40 | 50/50 | C-1 | D-2 | E-1 | E-2 | 80/20 | — |
| Example 14 | A-14 | Z37 | Z40 | 70/30 | C-1 | D-2 | E-1 | E-2 | 70/30 | — |
| Example 15 | A-15 | Z1 | — | 100 | C-1 | D-1 | E-1 | E-2 | 60/40 | — |
| Example 16 | A-16 | Z35 | — | 100 | C-1 | D-2 | E-1 | E-2 | 80/20 | — |
| Example 17 | A-17 | Z70 | — | 100 | C-1 | D-2 | E-1 | E-2 | 80/20 | — |
| Example 18 | A-18 | Z12 | — | 100 | C-2 | D-2 | E-1 | E-2 | 80/20 | — |
| Example 19 | A-1 | Z70 | Z35 | 50/50 | C-1 | D-2 | E-1 | E-2 | 70/30 | — |
| Example 20 | A-1 | Z70 | — | 100 | C-1 | D-2 | E-1 | E-3 | 80/20 | — |
| Example 21 | A-1 | Z22 | Z40 | 70/30 | C-1 | D-2 | E-1 | — | 100 | — |
| Example 22 | A-7 | Z4 | — | 100 | C-1 | D-1 | E-1 | E-3 | 60/40 | — |
| Example 23 | A-7 | Z32 | — | 100 | C-1 | D-2 | E-1 | E-2 | 80/20 | — |
| Example 24 | A-7 | Z35 | — | 100 | C-1 | D-2 | E-1 | — | 100 | — |
| Example 25 | A-7 | Z60 | — | 100 | C-2 | D-2 | E-1 | E-2 | 80/20 | — |
| Example 26 | A-5 | Z55 | Z35 | 50/50 | C-2 | D-2 | E-1 | E-4 | 70/30 | — |
| Example 27 | A-5 | Z60 | Z40 | 70/30 | C-1 | D-2 | E-1 | E-2 | 60/40 | — |
| Comp. Ex. 1 | A-19 | Z2 | — | 100 | C-1 | D-2 | E-1 | E-2 | 80/20 | — |
| Comp. Ex. 2 | A-20 | Z2 | — | 100 | C-1 | D-2 | E-1 | E-2 | 80/20 | — |
| Comp. Ex. 3 | A-21 | Z1 | — | 100 | C-1 | D-2 | E-1 | E-2 | 80/20 | F-1 |

The various ingredients used in Examples and Comparative Examples are as follows.

<Basic Compound>
C-1: Tetra-(n-butyl)ammonium hydroxide
C-2: Tri-n-hexylamine

<Surfactant>
D-1: Megafac F176 (manufactured by Dainippon Ink & Chemicals, Inc.)
D-2: PF6320 (manufactured by OMNOVA)

<Solvent>
E-1: Propylene glycol monomethyl ether acetate
E-2: Propylene glycol monomethyl ether
E-3: Ethyl lactate
E-4: Methyl amyl ketone <Dye>
F-1

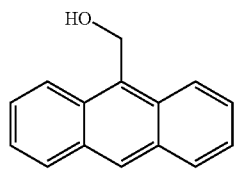

(F-1)

(2) Pattern Formation Method for Positive-Working Resist

Each of the resist films obtained is subjected to pattern exposure by means of a KrF excimer laser scanner (PAS5500/850C made by ASML, 248-nm wavelength, NA=0.70, Sigma=0.80). After the pattern exposure, each resist film is baked at 120° C. for 60 seconds, soaked in 2.38 mass % of tetramethylammonium hydroxide (TMAH) aqueous solution for 60 seconds, rinsed with water for 30 seconds, and then dried. The patterns thus formed are evaluated by the following methods.

(2-1) Sensitivity

Line widths of the patterns formed are observed under a scanning electron microscope (S-9260 made by Hitachi Ltd.), and irradiation energy required for the patterns corresponding to 0.20 μm lines of the mask (line/space ratio=1 to 1) to have a line width of 0.20 μm is defined as sensitivity (mJ/cm$^2$).

(2-2) Resolution Evaluation

What μm of line-and-space pattern (with a line/space ratio of 1 to 1) is the thinnest of all the patterns that can be resolved under the sensitivity determined in (2-1) is examined under the scanning electron microscope.

(2-3) LWR Evaluation

LWR measurement of the 0.20 μm resist patterns corresponding to 0.20 μm lines of the mask (line/space ratio=1 to 1) under the sensitivity determined in (2-1) is made with the scanning electron microscope.

(2-4) Remaining Standing Wave Evaluation

Profiles of the 0.20 μm resist patterns corresponding to 0.20 μm lines of the mask (line/space ratio=1 to 1) under the sensitivity determined in (2-1) are observed under a scanning electron microscope (S-4800 made by Hitachi Ltd.), and graded according to five ranks from A to E as described below.

A: Cases where no standing wave is observed at all and pattern profiles are very neat.

B: Cases where a slight standing wave is observed or unevenness is observed on the pattern profiles.

C: Cases where a standing wave is obviously recognized (No Examples fitted these cases).

D: Cases where a standing wave is rather strongly recognized.

E: Cases where a standing wave is strongly recognized.

(2-5) Swing (SW) Evaluation

Resist films having average thicknesses of 360 nm, 380 nm, 400 nm, 440 nm, 460 nm and 480 nm, respectively, are formed according to the methods of preparing and coating a positive-working resist compositions as described in (1), and therein patterns are formed using the pattern formation method for positive-working resist as described in (2). The line widths of the 0.20 μm patterns formed in the films having the foregoing various thicknesses in correspondence with 0.20 μm lines of the mask (line/space ratio=1 to 1) under the sensitivity of the resist film having an average thickness of 420 nm, which is determined in (2-1), are measured. The difference between maximum and minimum values of the line widths obtained by the above measurements is defined as swing value.

Evaluation results thus obtained are shown in Table 3.

TABLE 3

| | Sensitivity (mJ/cm$^2$) | Resolution (nm) | LWR (nm) | Remaining Standing Wave (grading according to five ranks) | SW (nm) |
|---|---|---|---|---|---|
| Example 1 | 18 | 155 | 6.3 | A | 30 |
| Example 2 | 20 | 140 | 6.4 | A | 31 |
| Example 3 | 22 | 160 | 7.2 | A | 35 |
| Example 4 | 16 | 165 | 8.7 | B | 35 |
| Example 5 | 20 | 160 | 8.9 | B | 36 |
| Example 6 | 23 | 165 | 7.2 | A | 34 |
| Example 7 | 18 | 165 | 7.6 | B | 41 |
| Example 8 | 17 | 165 | 7.4 | A | 34 |
| Example 9 | 20 | 160 | 7.5 | B | 36 |
| Example 10 | 25 | 170 | 9.2 | B | 41 |
| Example 11 | 22 | 165 | 8.2 | A | 39 |
| Example 12 | 25 | 160 | 6.7 | A | 35 |
| Example 13 | 25 | 165 | 7.2 | A | 35 |
| Example 14 | 32 | 175 | 6.8 | A | 25 |
| Example 15 | 18 | 150 | 6.3 | A | 34 |
| Example 16 | 29 | 170 | 8.2 | B | 35 |
| Example 17 | 20 | 145 | 6.2 | A | 34 |
| Example 18 | 18 | 155 | 6.1 | A | 34 |
| Example 19 | 16 | 145 | 6.3 | A | 35 |
| Example 20 | 14 | 145 | 6.3 | A | 31 |
| Example 21 | 18 | 150 | 6.7 | A | 30 |
| Example 22 | 25 | 160 | 7.5 | B | 40 |
| Example 23 | 26 | 170 | 8.8 | A | 36 |
| Example 24 | 24 | 170 | 7.9 | B | 42 |
| Example 15 | 24 | 155 | 6.8 | A | 34 |
| Example 26 | 25 | 155 | 6.7 | A | 36 |
| Example 27 | 25 | 150 | 7.2 | A | 31 |
| Comp. Ex. 1 | 45 | 180 | 14.2 | E | 85 |
| Comp. Ex. 2 | 50 | 185 | 15.5 | D | 90 |
| Comp. Ex. 3 | 39 | 190 | 13.8 | C | 48 |

It can be seen from Table 3 that, in pattern formation by exposure to KrF excimer laser, the present resist compositions deliver high sensitivity and high resolution, ensure superior LWR and swing properties, and achieve reduction in standing wave, compared with the resist compositions in comparative examples.

(3) Pattern Formation by EB Irradiation and Evaluation

Various ingredients are dissolved as shown in Table 2, and each of the solutions obtained is subjected to microfiltration with a membrane filter having a pore diameter of 0.1 μm. Thus, resist solutions are obtained.

On an 8-inch silicon wafer treated with hexamethyldisilazane, each of the resist solutions is coated by means of a spin coater Mark 8 made by Tokyo Electron Limited and further baked at 120° C. for 60 seconds, thereby forming film having an average thickness of 300 nm.

Each of the films thus formed is irradiated with electron beams by use of an electron-beam lithography system (HL750, made by Hitachi, Ltd., 50-KeV acceleration voltage), baked at 130° C. for 60 seconds, and then subjected to 60 seconds' dipping in a 2.38 mass % aqueous solution of tetramethylammonium hydroxide (TMAH), 30 seconds' rinsing with water, and further drying. The thus formed patterns are evaluated by the following methods.

(3-1) Sensitivity

Line widths of the patterns formed are observed under a scanning electron microscope (S-9260 made by Hitachi Ltd.), and irradiation energy required for the patterns corresponding to 0.15 μm lines of the mask (line/space ratio=1 to 1) to have a line width of 0.15 μm is defined as sensitivity (μC/cm$^2$).

(3-2) Resolution Evaluation

What μm of line-and-space pattern (with a line/space ratio of 1 to 1) is the thinnest of all the patterns that can be resolved under the sensitivity determined in (3-1) is examined under the scanning electron microscope.

(3-3) LWR Evaluation

LWR measurement of the 0.15 μm patterns corresponding to 0.15 μm lines of the mask (line/space ratio=1 to 1) under the sensitivity determined in (3-1) is made with the scanning electron microscope.

Evaluation results obtained are shown in Table 4.

TABLE 4

|  | Sensitivity (μC/cm$^2$) | Resolution (nm) | LWR (nm) |
| --- | --- | --- | --- |
| Example 1 | 6.0 | 85 | 4.8 |
| Example 2 | 7.1 | 70 | 4.4 |
| Example 3 | 7.5 | 90 | 5.7 |
| Example 4 | 5.3 | 100 | 6.7 |
| Example 5 | 6.7 | 90 | 7.4 |
| Example 6 | 7.7 | 100 | 5.7 |
| Example 7 | 6.4 | 95 | 5.6 |
| Example 8 | 5.7 | 95 | 5.9 |
| Example 9 | 6.7 | 95 | 6.0 |
| Example 10 | 8.7 | 100 | 7.2 |
| Example 11 | 7.3 | 95 | 6.7 |
| Example 12 | 8.3 | 90 | 5.2 |
| Example 13 | 8.5 | 95 | 5.2 |
| Example 14 | 10.7 | 110 | 5.3 |
| Example 15 | 6.2 | 80 | 4.8 |
| Example 16 | 9.7 | 100 | 6.2 |
| Example 17 | 7.1 | 80 | 4.7 |
| Example 18 | 6.4 | 85 | 4.6 |
| Example 19 | 5.5 | 75 | 4.3 |
| Example 20 | 4.7 | 75 | 4.3 |
| Example 21 | 6.0 | 80 | 4.7 |
| Example 22 | 8.5 | 90 | 6.0 |
| Example 23 | 9.1 | 100 | 7.3 |
| Example 24 | 8.0 | 100 | 6.4 |
| Example 25 | 8.2 | 90 | 5.3 |
| Example 26 | 8.3 | 90 | 4.7 |
| Example 27 | 8.3 | 85 | 5.2 |
| Comparative Example 1 | 15.0 | 180 | 13.4 |
| Comparative Example 2 | 16.9 | 185 | 12.5 |
| Comparative Example 3 | 13.0 | 190 | 13.5 |

It can be seen from Table 4 that, in pattern formation by electron-beam irradiation, the present resist compositions deliver high sensitivity and high resolution, and besides, they are superior in LWR property, compared with the resist compositions using the comparative resins.

(4) Pattern Formation by EL Irradiation and Evaluation

Each of the resist solutions of Examples 1, 2, 4, 5, 11, 13, 14, 16 and 17 and Comparative Examples 1 and 2 is coated on a hexamethyldisilazane-treated silicon wafer by means of a spin coater Mark 8 made by Tokyo Electron Limited, and further baked at 120° C. for 60 seconds, thereby forming film having an average thickness of 150 nm.

Exposure of each resist film to EUV light (13-nm wavelength, EUVES made by Litho Tech Japan Co., Ltd.) is performed as the amount of EUV exposure is changed from 0 to 20.0 mJ in increments of 0.5 mJ, and the thus exposed film is baked at 130° C. for 90 seconds. Thereafter, dissolution speed measurements with a 2.38 mass % aqueous solution of tetramethylammonium hydroxide (TMAH) are made on the film areas of varying exposure amounts, and thereby a sensitivity curve is obtained.

(Sensitivity and Resolution (Dissolution Contrast))

The exposure amount at the point where the dissolution speed of each resist saturates on the sensitivity curve is defined as sensitivity (mJ/cm$^2$) and, as the index of resolution, dissolution contrast (γ value) is calculated from the gradient of a straight-line portion of the sensitivity curve. The greater the γ value, the better the dissolution contrast, so the higher the resolution.

Evaluation results obtained are shown in Table 5.

TABLE 5

|  | Sensitivity (mJ/cm$^2$) | Resolution (γ value) |
| --- | --- | --- |
| Example 1 | 6.0 | 6.8 |
| Example 2 | 6.0 | 6.7 |
| Example 4 | 7.0 | 6.1 |
| Example 5 | 7.0 | 6.2 |
| Example 11 | 7.0 | 6.3 |
| Example 13 | 7.0 | 6.7 |
| Example 14 | 6.0 | 6.6 |
| Example 16 | 6.0 | 6.4 |
| Example 17 | 6.0 | 6.7 |
| Comparative Example 1 | 12.0 | 4.2 |
| Comparative Example 2 | 13.0 | 4.3 |

It can be seen from Table 5 that, in the pattern formation by EUV exposure, the present positive-working resist compositions deliver high sensitivity and high dissolution contrast, compared with the resist compositions in comparative examples.

As mentioned above, the present resist compositions achieve satisfactory results in EUV lithography also.

In accordance with the invention, it is possible to provide a resist composition that ensures high sensitivity, high resolution and satisfactory LWR in pattern formation through the irradiation with electron beams, KrF excimer layer light or EUV rays and, in KrF excimer laser lithography, further allows reductions of standing waves and swings resulting from variations in thickness of resist film on a highly reflective substrate. In addition, the invention can provide a pattern formation method using this resist composition.

The entire disclosure of each and every foreign patent application from which the benefit of foreign priority has been claimed in the present application is incorporated herein by reference, as if fully set forth.

What is claimed is:

1. A resist composition comprising:
   (A) a resin that comprises:
      a repeating unit represented by a following formula (I), and
      a repeating unit represented by a following formula (II); and
   (B) a compound capable of generating an acid upon irradiation with an actinic ray or radiation:

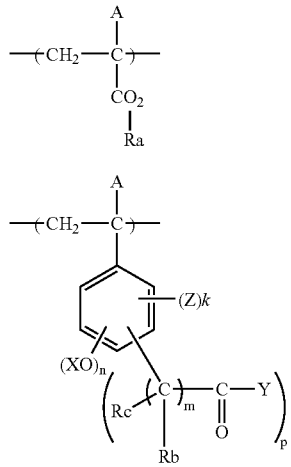

wherein
A represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group,
Ra represents a group capable of leaving by the action of an acid or a group capable of decomposing by the action of an acid,
each of Rb and Rc independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group,
X represents a hydrogen atom or an organic group,
Y represents a hydrogen atom or an organic group,
Z represents a substituent,
p represents an integer of 1 to 4, n represents an integer of 1 to 4 and k represents an integer of 0 to 3, provided that $2 \leq p+n+k \leq 5$,
when p is from 2 to 4, each Y, each Rb and each Rc may be the same as or different from every other Y, every other Rb and every other Rc, respectively,
when n is from 2 to 4, each X may be the same as or different from every other X,
when k is 2 or 3, each Z may be the same as or different from every other Z, and
m represents an integer of 0 to 10.

2. The resist composition according to claim 1, wherein m in the formula (II) represents 0.

3. The resist composition according to claim 1, wherein Y in the formula (II) represents an aryl group.

4. The resist composition according to claim 1, wherein Ra in the formula (I) represents a group comprising a cyclic carbon structure.

5. The resist composition according to claim 4, wherein Ra in the formula (I) is represented by a following formula (IRa);

wherein
AR represents an aryl group, and
Rn represents an alkyl group, a cycloalkyl group or an aryl group.

6. The resist composition according to claim 1, wherein the compound (B) comprises at least one kind of onium salt.

7. The resist composition according to claim 6, wherein the compound (B) comprises at least one kind of compound represented by a following formula (ZI) or (ZII);

wherein
each of $R_{201}$ to $R_{205}$ independently represents an aliphatic hydrocarbon group or an aromatic hydrocarbon group,
any two of $R_{201}$ to $R_{203}$ may combine with each other to form a ring,
$R_{204}$ and $R_{205}$ may combine with each other to form a ring, and
$X^-$ represents any of following anions (AN1), (AN3) and (AN4):

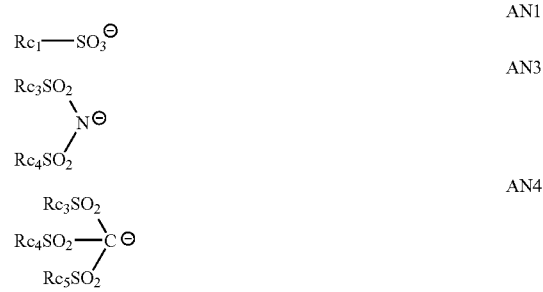

wherein
each $R_{c1}$ and $R_{c3}$ to $R_{c5}$ independently represents an organic group, and $R_{c3}$ and $R_{c4}$ may combine with each other to form a ring.

8. The resist composition according to claim 1, wherein the resin (A) further comprises a repeating unit represented by a following formula (III):

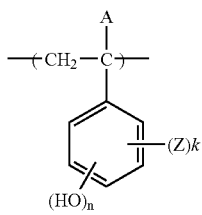
(III)

wherein
Z represents a substituent,
n is an integer of 1 to 5 and k is integer of 0 to 4, provided that $1 \leq n+k \leq 5$, and
when k is from 2 to 4, each Z may be the same as or different from every other Z.

9. The resist composition according to claim 1, wherein the formula (II) is represented by a following formula (IIa):

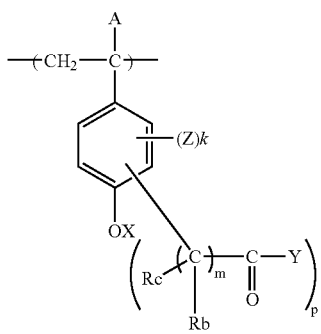
(IIa)

wherein
A, X, Y, Z, Rb, Rc, k, m and p have the same meanings as those in the formula (II), respectively.

10. The resist composition according to claim 9, wherein the formula (IIa) is represented by a following formula (IIb):

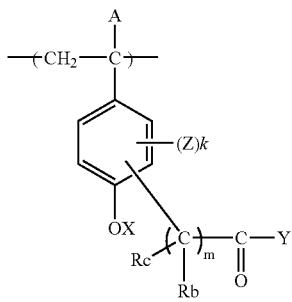
(IIb)

wherein
A, X, Y, Z, Rb, Rc, k and m have the same meanings as those in the formula (IIa), respectively.

11. The resist composition according to claim 10, wherein the formula (IIb) is represented by a following formula (IIc):

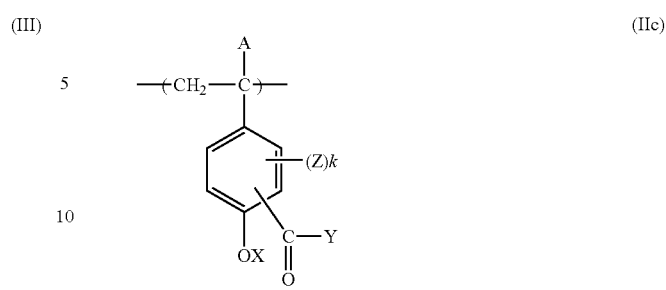
(IIc)

wherein
A, X, Y, Z and k have the same meanings as those in the formula (IIb), respectively.

12. The resist composition according to claim 10, wherein the formula (IIb) is represented by a following formula (IId):

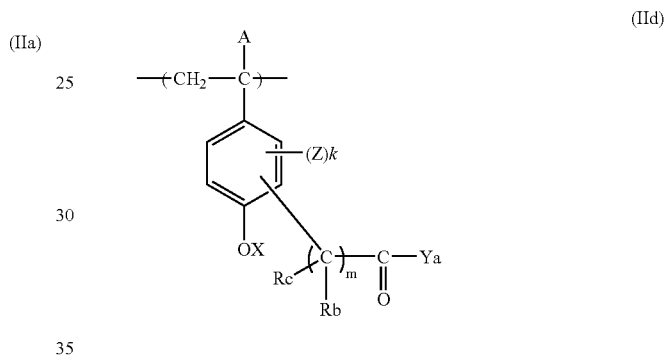
(IId)

wherein
A, X, Z, Rb, Rc, k and m have the same meanings as those in the formula (IIb), and
Ya represents an aryl group.

13. The resist composition according to claim 1, further comprising:
(C) a basic compound.

14. The resist composition according to claim 1, further comprising:
(D) a surfactant.

15. The resist composition according to claim 1, further comprising:
(E) a solvent.

16. The resist composition according to claim 15, wherein the solvent (E) comprises propylene glycol monomethyl ether acetate.

17. The resist composition according to claim 16, wherein the solvent (E) further comprises at least one solvent selected from the group consisting of propylene glycol monomethyl ether, ethyl lactate, butyl acetate, ethoxyethyl propionate and methyl amyl ketone.

18. The resist composition according to claim 1, which is exposed by irradiation with KrF excimer laser, electron beams, X-rays or EUV.

19. A method for forming patterns, comprising:
forming a resist film from the resist composition according to claim 1,
exposing the formed resist film, and
developing the exposed resist film.

* * * * *